US012414301B2

(12) United States Patent
Woo et al.

(10) Patent No.: US 12,414,301 B2
(45) Date of Patent: Sep. 9, 2025

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Youngbum Woo, Suwon-si (KR); Joonsung Lim, Seongnam-si (KR); Junhyoung Kim, Seoul (KR); Seungmin Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 378 days.

(21) Appl. No.: 17/961,070

(22) Filed: Oct. 6, 2022

(65) Prior Publication Data

US 2023/0217661 A1    Jul. 6, 2023

(30) Foreign Application Priority Data

Dec. 30, 2021  (KR) .................... 10-2021-0192300

(51) Int. Cl.
*H10B 43/40*    (2023.01)
*H01L 23/522*   (2006.01)
(Continued)

(52) U.S. Cl.
CPC ......... *H10B 43/40* (2023.02); *H01L 23/5226* (2013.01); *H01L 23/5283* (2013.01); *H10B 43/27* (2023.02); *H10B 43/35* (2023.02)

(58) Field of Classification Search
CPC ........ H10B 43/40; H10B 43/27; H10B 43/35; H10B 41/27; H10B 41/50; H10B 43/50; H10B 43/30; H01L 23/5226; H01L 23/5283; H01L 21/76805; H01L 21/76826; H01L 21/76832; H01L 21/76834

See application file for complete search history.

(56) References Cited

U.S. PATENT DOCUMENTS 7,888,253 B2    2/2011  Usui et al.
9,281,276 B2    3/2016  Usami et al.
(Continued)

FOREIGN PATENT DOCUMENTS

JP      2011-086837 A      4/2011
KR    1020210032920 A      3/2021
(Continued)

*Primary Examiner* — Karen Kusumakar
(74) *Attorney, Agent, or Firm* — Muir Patent Law, PLLC

(57) ABSTRACT

A semiconductor device includes a contact plug forming a signal path electrically connecting a bitline or wordlines and an upper connection pattern to each other, a lower insulating structure includes first and second insulating portions; the contact plug penetrates through the second insulating portion and contacts the upper connection pattern; the first insulating portion includes first and second lower layers, the second lower layer having a thickness smaller than the first lower layer; the second insulating portion includes a first upper layer contacting the second lower layer and covering a portion of an upper surface of the upper connection pattern, and a second upper layer on the first upper layer, the second upper layer having a thickness greater than the first upper layer; and materials of the second lower layer and first upper layer is different from materials of the first lower layer and the second upper layer.

20 Claims, 18 Drawing Sheets

(51) Int. Cl.
*H01L 23/528* (2006.01)
*H10B 43/27* (2023.01)
*H10B 43/35* (2023.01)

(56) References Cited

U.S. PATENT DOCUMENTS

| | | |
|---|---|---|
| 10,163,794 B2 | 12/2018 | Wang et al. |
| 10,249,577 B2 | 4/2019 | Lee et al. |
| 10,879,112 B2 | 12/2020 | Anderson et al. |
| 11,011,469 B2 | 5/2021 | Kim et al. |
| 11,355,486 B2 * | 6/2022 | Mizutani ................. H01L 24/80 |
| 2010/0261345 A1 | 10/2010 | Na |
| 2021/0135107 A1 | 5/2021 | Kim et al. |
| 2021/0242236 A1 * | 8/2021 | Shin ....................... H10B 43/10 |
| 2023/0080606 A1 | 3/2023 | Lee et al. |

FOREIGN PATENT DOCUMENTS

| | | |
|---|---|---|
| KR | 1020210125152 A | 10/2021 |
| KR | 10-2023-0037864 A | 3/2023 |

* cited by examiner

SEMICONDUCTOR DEVICE AND DATA STORAGE SYSTEM INCLUDING THE SAME

CROSS-REFERENCE TO RELATED APPLICATION(S)

This application claims benefit of priority to Korean Patent Application No. 10-2021-0192300 filed on Dec. 30, 2021, in the Korean Intellectual Property Office, the disclosure of which is incorporated herein by reference in its entirety.

BACKGROUND

1. Field

Embodiments relate to a semiconductor device and a data storage system including the same.

2. Description of the Related Art

In an electronic system for data storage, a semiconductor device may store high-capacity data. Accordingly, methods of increasing data storage capacity of a semiconductor device may be considered. For example, a semiconductor device including three-dimensionally arranged memory cells, rather than two-dimensionally arranged memory cells, may increase data storage capacity of a semiconductor device.

SUMMARY

The embodiments may be realized by providing a semiconductor device including a lower structure including a semiconductor substrate, a circuit device on the semiconductor substrate, a circuit interconnection structure including connection patterns electrically connected to the circuit device and at different height levels, and a lower insulating structure covering the circuit device and the circuit interconnection structure on the semiconductor substrate; an upper structure on the lower structure and including wordlines stacked and spaced apart from each other in a vertical direction, a vertical memory structure penetrating through the wordlines, and a bitline electrically connected to the vertical memory structure on the vertical memory structure; and a contact plug forming at least a portion of a signal path electrically connecting at least one of the bitline and the wordlines and at least one of the connection patterns to each other, wherein the connection patterns include an upper connection pattern contacting the contact plug; the lower insulating structure includes a first insulating portion on a side surface of the upper connection pattern and a second insulating portion on the first insulating portion and on the upper connection pattern; the contact plug penetrates through the second insulating portion and contacts the upper connection pattern; the first insulating portion includes a first lower layer and a second lower layer on the first lower layer, the second lower layer having a thickness smaller than a thickness of the first lower layer; the second insulating portion includes a first upper layer contacting the second lower layer and covering at least a portion of an upper surface of the upper connection pattern, and a second upper layer on the first upper layer, the second upper layer having a thickness greater than a thickness of the first upper layer; and a material of the second lower layer and the first upper layer is different from a material of the first lower layer and the second upper layer.

The embodiments may be realized by providing a semiconductor device including a lower structure including a semiconductor substrate, a circuit device on the semiconductor substrate, a circuit interconnection structure including connection patterns electrically connected to the circuit device and at different height levels, and a lower insulating structure covering the circuit device and the circuit interconnection structure on the semiconductor substrate; an upper structure on the lower structure and including wordlines stacked and spaced apart from each other in a vertical direction, a vertical memory structure penetrating through the wordlines, and a bitline electrically connected to the vertical memory structure on the vertical memory structure; and a contact plug forming at least a portion of a signal path electrically connecting at least one of the bitline and the wordlines and at least one of the connection patterns to each other, wherein the connection patterns include an upper connection pattern contacting the contact plug; the lower insulating structure includes a first insulating portion on a side surface of the upper connection pattern and a second insulating portion on the first insulating portion and on the upper connection pattern; the contact plug penetrates through the second insulating portion and contacts the upper connection pattern; the upper connection pattern includes a plug portion and a barrier layer covering a side surface and a bottom surface of the plug portion; the upper connection pattern includes a groove between an upper end of the barrier layer and the plug portion, in an upper region of the upper connection pattern; the second insulating portion includes a first upper layer contacting the first insulating portion and covering at least a portion of an upper surface of the upper connection pattern, and a second upper layer on the first upper layer, the second upper layer having a thickness greater than a thickness of the first upper layer; the upper end of the barrier layer is spaced apart from the plug portion by the groove; and a material of the first upper layer is different from a material of the second upper layer.

The embodiments may be realized by providing a data storage system including a semiconductor device including an input/output pad; and a controller electrically connected to the semiconductor device through the input/output pad and configured to control the semiconductor device, wherein the semiconductor device includes a lower structure including a semiconductor substrate, a circuit device on the semiconductor substrate, a circuit interconnection structure including connection patterns electrically connected to the circuit device and at different height levels, and a lower insulating structure covering the circuit device and the circuit interconnection structure on the semiconductor substrate; an upper structure on the lower structure and including wordlines stacked and spaced apart from each other in a vertical direction, a vertical memory structure penetrating through the wordlines, and a bitline electrically connected to the vertical memory structure on the vertical memory structure; and a contact plug forming at least a portion of a signal path electrically connecting at least one of the bitline and the wordlines and at least one of the connection patterns to each other, the connection patterns include an upper connection pattern contacting the contact plug; the lower insulating structure includes a first insulating portion on a side surface of the upper connection pattern and a second insulating portion on the first insulating portion and the upper connection pattern; the contact plug penetrates through the second insulating portion and contacts the upper connection pattern; the first insulating portion includes a first lower layer and a second lower layer on the first lower layer, the second lower layer having a thickness smaller than a thickness of the first lower layer; the second insulating portion includes a first upper layer contacting the second lower layer and covering at least a portion of an upper surface of the upper connection pattern, and a second upper layer on the first upper layer, the second upper layer having a thickness greater than a thickness of the first upper layer; and a material of the second lower layer and the first upper layer is different from a material of the first lower layer and the second upper layer.

BRIEF DESCRIPTION OF DRAWINGS

Features will be apparent to those of skill in the art by describing in detail exemplary embodiments with reference to the attached drawings in which.

DETAILED DESCRIPTION

Figure 1A:
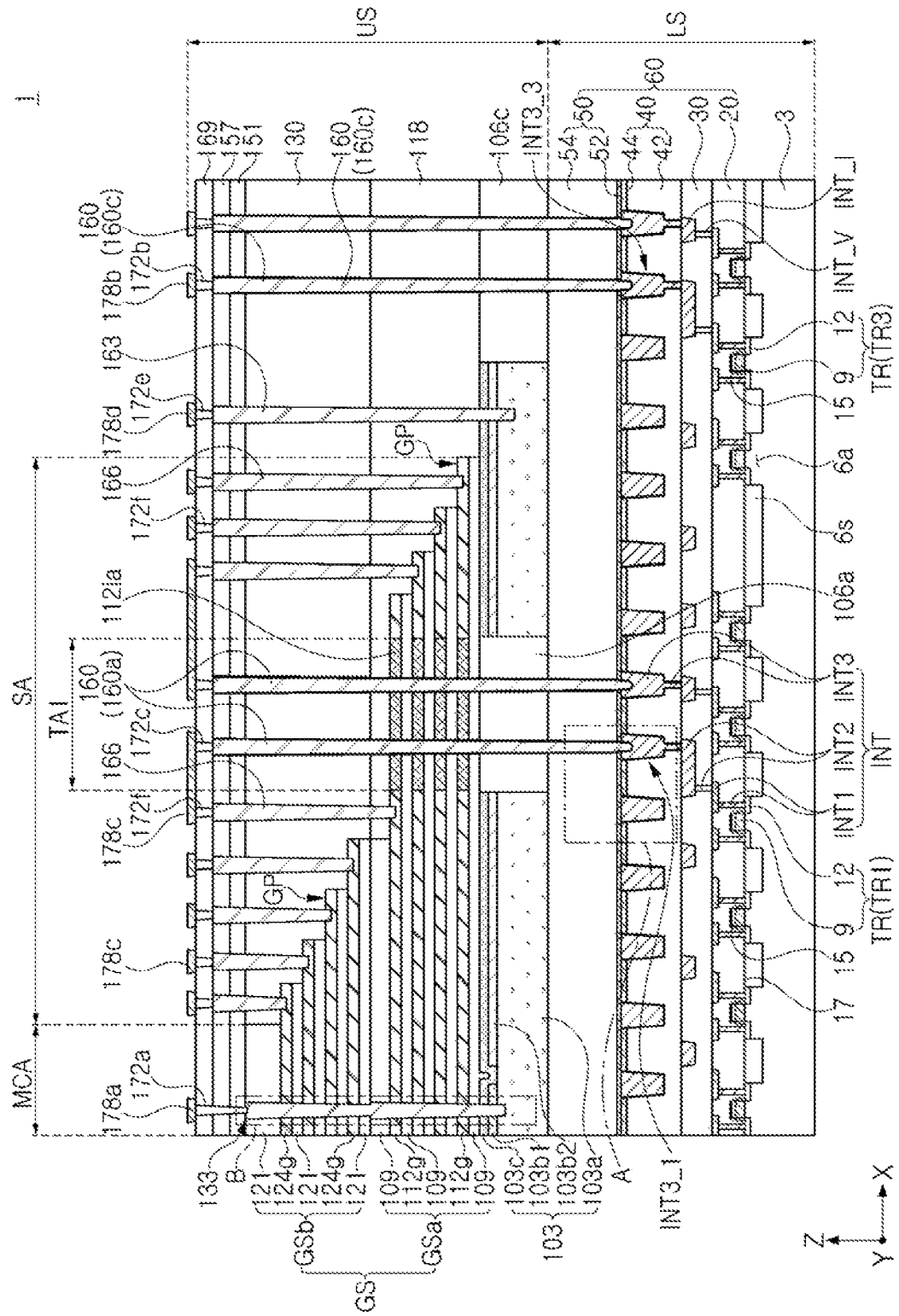
FIGS. 1A, 1B, 2, and 3 are schematic views of an example of a semiconductor device according to an example embodiment.
Figure 1B:
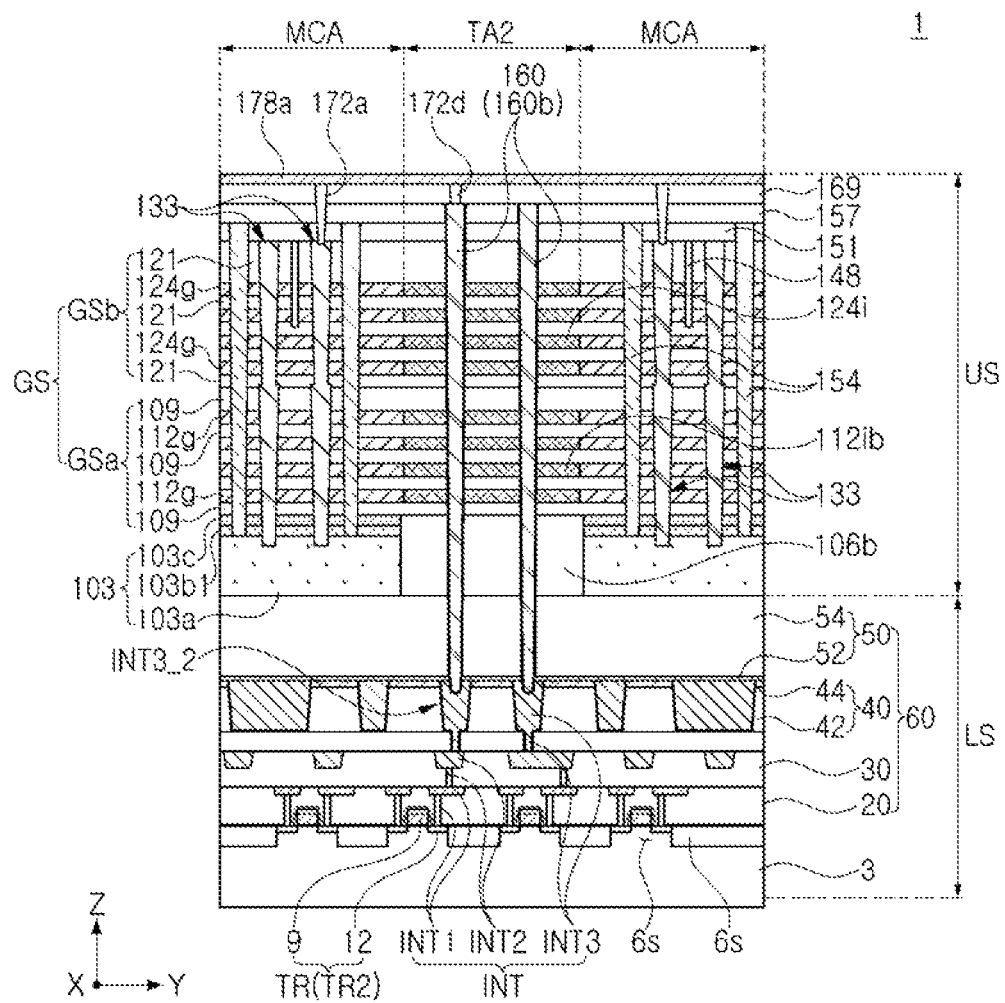
Figure 2:
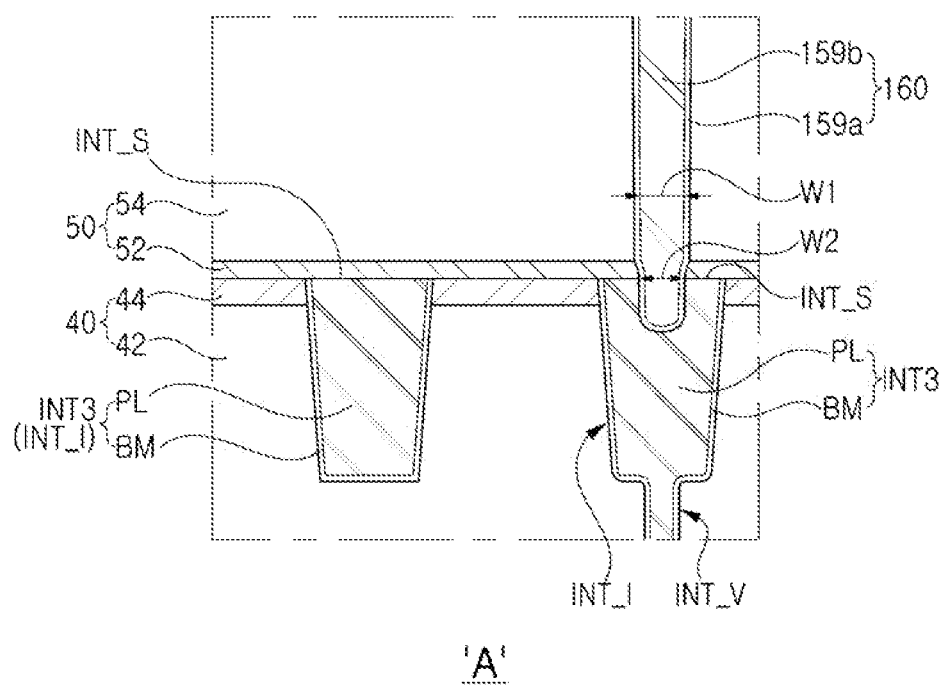

An example of a semiconductor device according to an example embodiment will be described with reference to FIGS. 1A, 1B, 2 and 3. FIG. 1A is a longitudinal cross-sectional view of a semiconductor device according to an example embodiment, taken in an X-direction, and FIG. 1B is a longitudinal cross-sectional view of a semiconductor device according to an example embodiment, taken in a Y-direction. FIG. 2 is a partially enlarged view of portion "A" of FIG. 1A, and FIG. 2B is an enlarged partial view of portion "B" of FIG. 1A.

Referring to FIGS. 1A, 1B, 2 and 3, a semiconductor device 1 according to an example embodiment may include a lower structure LS and an upper structure US on the lower structure 2.

The lower structure LS may include a semiconductor substrate 3, a circuit device TR on the semiconductor substrate 3, a circuit interconnection structure INT electrically connected to the circuit device TR on the semiconductor substrate 3, and a lower insulating structure 60 covering the circuit device TR and the circuit interconnection structure INT on the semiconductor substrate 3.

The lower structure LS may further include a field region 6s defining an active region 6a in the semiconductor substrate 3. The field region 6s may be formed as a shallow trench isolation (STI) layer.

The circuit device TR may include a transistor including a peripheral gate 9 and peripheral sources/drains 12. The peripheral sources/drains 12 may be in the active region 6a and may be spaced apart from each other. The peripheral gate 9 may be on the active region 6a between the peripheral sources/drains 18.

The lower structure LS may further include a gate capping pattern 15 covering the peripheral gate 9. The gate capping pattern 15 may include a material such as a silicon nitride. The lower structure LS may further include an insulating liner 17 covering the circuit device TR on the semiconductor substrate 3 including the active region 6a and the field region 6s. The insulating liner 17 may include a silicon nitride.

The circuit interconnection structure INT may include a plurality of connection patterns INT1, INT2, and INT3 at different height levels. In an implementation, the plurality of connection patterns INT1, INT2, and INT3 may include lower connection patterns INT1 electrically connected to the circuit element TR, intermediate connection patterns INT2 electrically connected to the lower connection patterns INT1 and disposed on a level, higher than a level of the lower connection patterns INT1, and upper connection patterns INT3 electrically connected to the intermediate connection patterns INT2 and at a level, higher than the level of the intermediate connection patterns INT2 (e.g., a greater distance in a vertical Z direction from the semiconductor substrate 3).

Each of the plurality of connection patterns INT1, INT2, and INT3 may include an interconnection portion INT_I and a via portion INT_V extending downwardly from a portion of the interconnection portion INT_I.

In an implementation, at least one of the plurality of connection patterns INT1, INT2, and INT3 may have a dual damascene structure formed by a dual damascene process of forming the interconnection portion INT_I and the via portion INT_V at the same time. The damascene process may include forming an insulating layer, forming an opening in the insulating layer, and forming a connection pattern in the opening.

In an implementation, at least one of the plurality of connection patterns INT1, INT2, and INT3 may include a single damascene structure, in which the via portion INT_V is formed by a single damascene process, and a single damascene structure in which the interconnection portion INT_I is formed by a single damascene process.

In an implementation, among the plurality of connection patterns INT1, INT2, and INT3, connection patterns at different levels may have a structure in which a single damascene structure and a dual damascene structure are combined.

Each of the plurality of connection patterns INT1, INT2, and INT3 may include a metal material pattern and a conductive barrier layer covering a side surface and a bottom surface of the metal material pattern. In an implementation, the metal material pattern may include a metal such as tungsten, and the conductive barrier layer may include a metal nitride such as a titanium nitride. In an implementation, each of the plurality of connection patterns INT1, INT2, and INT3 may include a metal material pattern PL and a conductive barrier layer BM covering a side surface and a bottom surface of the metal material pattern PL. The lower insulating structure 60 may be disposed on the insulating liner 24. The metal material pattern PL may be referred to as a "plug portion."

The lower insulating structure 60 may include lower insulating portions 20 and 30 and upper insulating portions 40 and 50 on the lower insulating portions 20 and 30.

The lower insulating portions 20 and 30 include a first lower insulating portion 20, surrounding side surfaces of the lower connection patterns INT1, and a second lower insulating portion 30 surrounding side surfaces of the intermediate connection patterns INT2.

The upper insulating portions 40 and 50 include a first upper insulating portion 40, surrounding side surfaces of the upper connection patterns INT3, and a second upper insulating portion 50 on the first upper insulating portion 40.

The first upper insulating portion 40 may include a first lower layer 42 and a second lower layer 44, having a thickness smaller than a thickness of the first lower layer 42, on the first lower layer 42. The second upper insulating portion 50 may include a first upper layer 52 and a second upper layer 54, having a thickness greater than a thickness of the first upper layer 52, on the first upper layer 52.

The second lower layer 44 and the first upper layer 52 may contact each other.

A material of the second lower layer 44 and the first upper layer 52 may be different from a material of the first lower layer 42 and the second upper layer 54. In an implementation, the second lower layer 44 and the first upper layer 52 may be formed of a first material, and the first lower layer 42 and the second upper layer 54 may be formed of a second material, different from the first material. The second material may be formed of a silicon oxide or a low-K dielectric, and the first material may be formed of silicon nitride or a silicon nitride based material. As used herein, the term "or" is not an exclusive term, e.g., "A or B" would include A, B, or A and B In an implementation, the second lower layer 44 and the first upper layer 52 may be formed of the same material, e.g., a silicon nitride, and the silicon nitride of the second lower layer 44 may be covalently bonded to the silicon nitride of the first upper layer 52.

A thickness of the second lower layer 44 may be different from a thickness of the first upper layer 52.

A thickness of the second lower layer 44 may be greater than a thickness of the first upper layer 52.

The second lower layer 44 and the first upper layer 52 may have an optimal thickness to help prevent a defect such as a bridge between the upper connection patterns INT_3. In an implementation, to more effectively prevent a defect such as a bridge between the upper connection patterns INT_3, the thickness of the second lower layer 44 may be in a range of about 400 angstroms (Å) to about 600 angstroms (Å), and the thickness of the first upper layer 52 may be in a range of about 285 angstroms (Å) to about 315 angstroms (Å).

The upper structure US may include a pattern structure 103 on the lower insulating structure 75, a first internal insulating layer 106a and a second internal insulating layer 106b penetrating through the pattern structure 103, and an intermediate insulating layer 106c on an external side surface of the patterned structure 103. The pattern structure 103 may contact an upper surface of the lower insulating structure 60.

The pattern structure 103 may include a lower pattern layer 103a, a first intermediate pattern layer 103b1 and a second intermediate pattern layer 103b2 spaced apart from each other on the lower pattern layer 103a, and an upper pattern layer 103c covering the first and second intermediate pattern layers 103b1 and 103b2 on the lower pattern layer 103a. The lower pattern layer 103a may have a thickness greater than a thickness of each of the first intermediate pattern layer 103b1, the second intermediate pattern layer 103b2, and the upper pattern layer 103c.

At least one of the lower pattern layer 103a, the first intermediate pattern layer 103b1, and the upper pattern layer 103c may include a silicon layer. In an implementation, at least one of the lower patterned layer 103a, the first intermediate patterned layer 103b1, and the upper patterned layer 103c may include a doped polysilicon layer, e.g., an N-type polysilicon layer.

The second intermediate pattern layer 103b2 may include a first material layer, a second material layer, and a third material layer sequentially stacked. In the second intermediate pattern layer 103b2, each of the first material layer and the third material layer may be a silicon oxide layer, and the second material layer may be a silicon nitride layer.

The upper structure US may further include a stack structure GS and first and second capping insulating layers 118 and 130 covering at least a portion of the stack structure GS. The stack structure GS may be disposed on the pattern structure 103.

The stack structure GS may include a lower stack structure GSa and an upper stack structure GSb on the lower stack structure GSa. The lower stack structure GSa may include first interlayer insulating layers 109 and first gate layers 112g alternately stacked. Among the first interlayer insulating layers 109 and the first gate layers 112g, each of an uppermost layer and a lowermost layer may be a first interlayer insulating layer.

The upper stack structure GSb may include second interlayer insulating layers 121 and second gate layers 124g alternately stacked. Among the second interlayer insulating layers 121 and the second gate layers 124g, each of an uppermost layer and a lowermost layer may be a second interlayer insulating layer.

The first and second gate layers 121g and 124g may be referred to as gate electrodes.

The stack structure GS may have a substantially planar upper surface in the memory cell array region MCA on the pattern structure 103, and may have a staircase shape in a staircase region SA on the pattern structure 103. In an implementation, the first and second gate layers 112g and 124g may be stacked while being spaced apart from each other in the vertical direction Z in the memory cell array region MCA, and may extend from the memory cell array region MCA to the staircase region SA to include gate pads GP arranged in a staircase form in a staircase region SA.

In a first through-region TA1 in the staircase region SA, the stack structure GS may include horizontal insulating layers 112ia disposed at the same level as at least a portion of the first and second gate layers 112g and 124g. The horizontal insulating layers 112ia may be formed of a silicon nitride. The first through-region TA1 may overlap the first internal insulating layer 106a.

In a second through-region TA2 between the memory cell array regions MCA, the stack structure GS may include horizontal insulating layers 112ib and 124i at the same level as at least a portion of the first and second gate layers 112g and 124g. The horizontal insulating layers 112ib and 124i may be formed of a silicon nitride. The second through-region TA2 may vertically overlap the second internal insulating layer 106b.

The upper structure US may further include a first upper insulating layer 151, a second upper insulating layer 157, and a third upper insulating layer 169 sequentially stacked on the stack structure GS and the second capping insulating layer 130.

The upper structure US may further include vertical memory structures 133 penetrating through the stack structure GS in the memory cell array region MCA. The vertical memory structures 133 may contact the pattern structure 103.

The upper structure US may further include an upper separation pattern 148 penetrating through and separating a single or a plurality of overlying second gate layers, among the second gate layers 124g, for example, string select lines. The upper separation pattern 148 may be disposed on a level, higher than a level of wordlines, among the gate layers 124g. The upper separation pattern 148 may be formed of an insulating material such as a silicon oxide.

The upper structure US may further include separation structures 154 penetrating through and separating the first upper insulating layer 151 and the stack structure GS. The vertical memory structures 133 may be between the separation structures 154 adjacent to each other. The separation structures 154 may penetrate through the upper pattern layer 103c and the first intermediate pattern layer 103b1 and may contact the lower pattern layer 103a.

In an implementation, the separation structures 154 may be formed of an insulating material, e.g., a silicon oxide or a high-K dielectric.

In an implementation, each of the separation structures 154 may include a conductive pattern and an insulating material layer covering a side surface of the conductive pattern.

The upper structure US may further include gate contact plugs 166 contacting the gate pads GP in the staircase region SA. In an implementation, the gate contact plugs 166 may contact the gate pads GP and may extend upwardly to penetrate through the first and second upper insulating layers 151 and 157.

The upper structure US may further include a source contact plug 163 spaced apart from the first and second gate layers 112g and 124g and contacting the lower pattern layer 103a of the pattern structure 103.

The semiconductor device 1 may further include peripheral contact plugs 160 electrically connected to the upper connection patterns INT3 while being in contact therewith and penetrating through the second upper insulating portion 50 of the lower insulating structure 60. Upper surfaces of the peripheral contact plugs 160 may be at a level, higher than a level of an uppermost gate layer, among the first and second gate layers 112g and 124g, and lower surfaces of the peripheral contact plugs 160 may contact the upper connection patterns INT3.

The peripheral contact plugs 160 may contact the plurality of upper connection patterns, penetrate through the second upper insulating portion 50 of the lower insulating structure 60, and extend upwardly. Upper surfaces of the peripheral contact plugs 160 may be at a level, higher than a level of an uppermost gate layer, among the first and second gate layers 112g and 124g, and lower surfaces of the peripheral contact plugs 160 may contact the upper connection patterns INT3.

The circuit device TR may include a first circuit device TR1, a second circuit device TR2, and a third circuit device TR3. The first circuit device TR1 may be a transistor which may constitute a decoder circuit, the second circuit device TR2 may be a transistor which may constitute a page buffer, and the third circuit device TR3 may be a transistor which may constitute a logic circuit.

The upper connection patterns INT3 may include a first upper connection pattern INT3_1 electrically connected to the first circuit device TR1, and a second upper connection pattern INT3_2 electrically connected to the second circuit device TR2, and a third upper connection pattern INT3_3 electrically connected to the third circuit device TR3.

The peripheral contact plugs 160 include a first peripheral contact plug 160a contacting the first upper connection pattern 60a, a second peripheral contact plug 160b contacting the second upper connection pattern 60b, and a third peripheral contact plug 160c contacting the third upper connection pattern 60c.

The peripheral contact plugs 160 may extend inwardly of or from the upper connection patterns INT3. In an implementation, a contact area between the peripheral contact plugs 160 and the upper connection patterns INT3 may be increased to help improve contact resistance characteristics.

Each of the peripheral contact plugs 160 may have a maximum width of a first width W1 in a first portion penetrating through the second upper layer 54 of the second upper insulating portion 50, and may have a minimum width of a second width W2 in a second portion penetrating through the first upper layer 52 of the second upper insulating portion 50. The second width W2 may be smaller than the first width W1.

In each of the peripheral contact plugs 160, a portion of the second upper insulating portion 50 penetrating through the first upper layer 52 may have a width decreased in a direction toward a lower portion from an upper portion.

The first peripheral contact plug 160a may penetrate through the first internal insulating layer 106a and the first through-region TA1, and may extend upwardly to penetrate through the first and second upper insulating layers 151 and 157. The second peripheral contact plug 160b may penetrate through the second internal insulating layer 106b and the second through region TA2, and may extend upwardly to penetrate through the first and second upper insulating layers 151 and 157. The third peripheral contact plug 160c may penetrate through the intermediate insulating layer 106c, the first and second capping insulating layers 118 and 130, and the first and second upper insulating layers 151 and 157.

The upper structure US may further include a bitline 178a, a peripheral interconnection line 178b, a gate interconnection line 178c, and a source interconnection line 178d on the third interlayer insulating layer 169.

The upper structure US may further include a peripheral upper contact plug 172c electrically connecting the first peripheral contact plug 160a and the gate interconnection line 178c between the first peripheral contact plug 160a and the gate interconnection line 178c, a peripheral upper contact plug 172d electrically connecting the second peripheral contact plug 160b and the bitline 178a between the second peripheral contact plug 160b and the bitline 178a, and a peripheral upper contact plug 172b electrically connecting the third peripheral contact plug 160c and the peripheral interconnection line 178b between the third peripheral contact plug 160c and the peripheral interconnection line 178b The upper structure US may further include a bitline contact plug 172a electrically connecting the bitline 178a and the vertical memory structure 133 between the bitline 178a and the vertical memory structure 133, a gate upper contact plug 172f electrically connecting the gate contact plug 166 and the gate interconnection line 178c between the gate contact plug 166 and the gate interconnection line 178c, and a source upper contact plug 172e electrically connecting the source contact plug 163 and the source interconnection line 178d between the source contact plug 163 and the source interconnection line 178d.

The first peripheral contact plugs 160a and the circuit interconnection structure INT may be a signal path for electrically connecting the intermediate gate layers 121g_M and 124g_M which may be wordlines, among the gate layers 121g and 124g, to the first circuit device TR1, and the second peripheral contact plugs 160b and the circuit interconnection structure INT may be a signal path for electrically connecting the bitline to the second circuit device TR2. The first upper connection pattern INT3_1 of the circuit interconnection structure INT may be a signal path for electrically connecting the first peripheral contact plugs 160a and the first circuit device TR1 to each other, and the second upper connection pattern INT3_2 may be a signal path for electrically connecting the second peripheral contact plug 160b and the second circuit device TR2 to each other. In an implementation, the semiconductor device 1 according to an example embodiment may include the peripheral contact plug 160a or 160b, at least a portion of a signal path for electrically connecting at least one of the bitline 178a and the wordlines 121g_M and 124g_M and at least one of the connection patterns INT1, INT2, and INT3 to each other.

By including the second lower layer 44 between upper regions of the upper connection patterns INT3 and the first upper layer 52 coupled to the second lower layer 44 and covering at least a portion of an upper surface of each of the upper connection patterns INT3, leakage current may be prevented from being generated between the upper connection patterns INT3 adjacent to each other.

In an implementation, the second lower layer 44 and the first upper layer 52 may allow the adjacent upper connection patterns INT3 to be closer to each other, so that the degree of integration of the circuit interconnection structure INT may be improved and the degree of integration of the circuit interconnection structure INT may be improved. As a result, the degree of integration of the semiconductor device 1 may be improved.

Next, examples of the vertical memory structure 133, the pattern structure 103, and the first and second gate layers 112g and 124g described above will be described with reference to FIG. 3.

Figure 3:
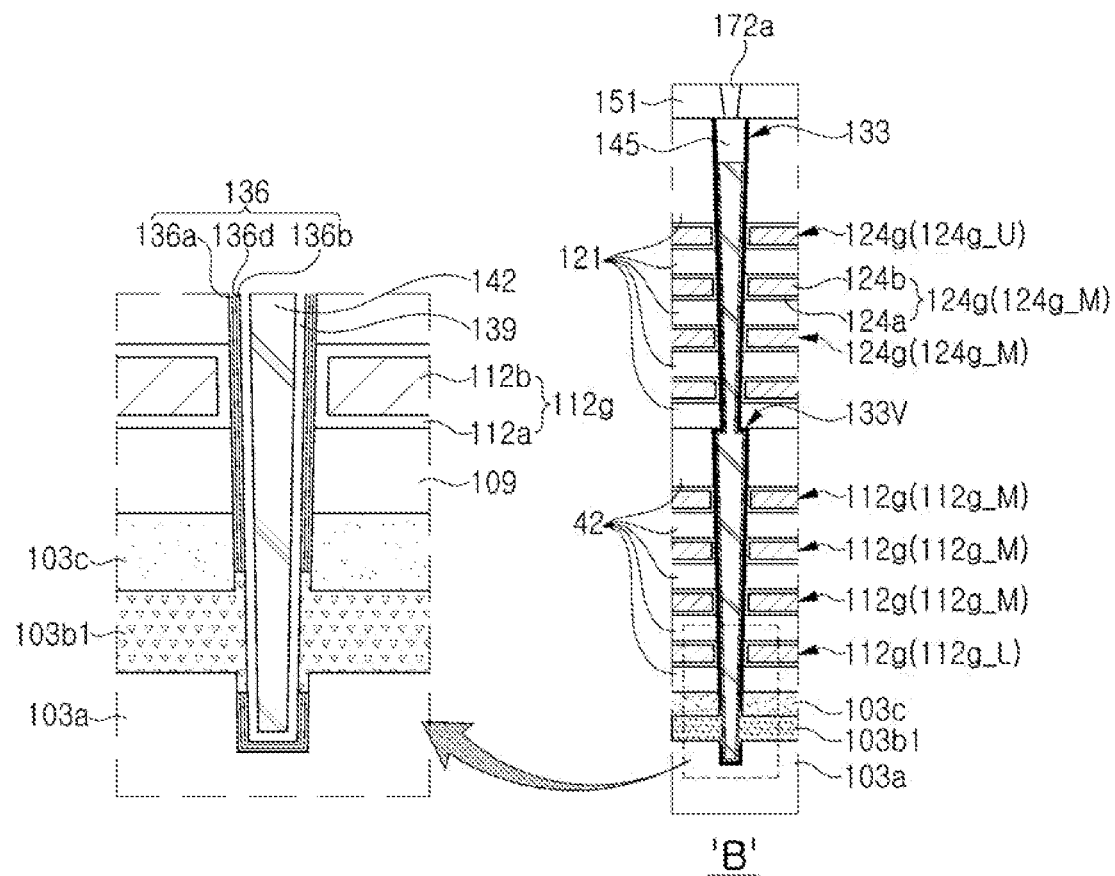

Referring to FIG. 3, the vertical memory structure 133 may include and insulating core region 142, a channel layer 139 covering a side surface and a bottom surface of the insulating core region 142, a pad pattern 145 contacting the channel layer 139 on the insulating core region 142, and a data storage structure 136 covering at least an external surface of the channel layer 139. The data storage structure 136 may include a first dielectric layer 136a, a second dielectric layer 136b, and a data storage layer 136d between the first and second dielectric layers 136a and 136b. The second dielectric layer 136c may be between the data storage layer 136d and the channel layer 139.

The insulating core region 142 may include a silicon oxide, e.g., a silicon oxide formed by an atomic layer deposition process, or a silicon oxide in which voids are formed. The second dielectric layer 136b may include a silicon oxide or a silicon oxide doped with impurities. The first dielectric layer 136a may include, e.g., a silicon oxide or a high-K dielectric. The data storage layer 136d may include a material, capable of storing data by trapping charges, e.g., a silicon nitride. The data storage layer 136d may include regions, capable of storing data in a semiconductor device such as a flash memory device. The channel layer 139 may include a silicon layer, e.g., an undoped silicon layer or a silicon layer having P-type conductivity. The pad pattern 49 may include, e.g., doped polysilicon, a metal nitride (e.g., TiN or the like), a metal (e.g., W or the like), or a metal-semiconductor compound (e.g., TiSi or the like). The bitline contact plug 172a may contact and be electrically connected to the pad pattern 145 of the vertical memory structure 133.

In a portion of the vertical memory structure extending inwardly of the pattern structure 103, the first intermediate pattern layer 103b1 may penetrate through the data storage structure 136 and may contact the channel layer 139, and the data storage structure 136 may be separated into upper and lower portions by the first intermediate pattern layer 103b1. The first intermediate pattern layer 103b1 of the pattern structure 103 contacting the channel layer 139 may include a silicon layer having N-type conductivity.

The vertical memory structure 133 may include a side slope change portion 133V between an uppermost first gate layer, among the first gate layers 112g, and a lowermost second gate layer, among the second gate layers 124g. The side slope change portion 133V may refer to a portion in which a slope changes between an adjacent upper side surface and an adjacent lower side surface. In an implementation, the side slope change portion 133V may refer to a side portion having a gentle slope between a steep upper side surface and a steep lower side surface.

Each of the first gate layers 112g may include a first layer 121a and a second layer 121b. Each of the second gate layers 124g may include a third layer 124a and a fourth layer 124b. The first layer 121a may cover upper and lower surfaces of the second layer 121b, and may extend between the vertical memory structure 133 and the second layer 121b. The first layer 124a may cover upper and lower surfaces of the second layer 124b, and may extend between the vertical memory structure 133 and the second layer 124b.

In an implementation, the first and third layers 121a and 124a may include a dielectric material, and the second and fourth layers 121b and 124b may include a conductive material. In an implementation, the first and third layers 121a and 124a may include a high-K dielectric such as AlO, and the second and fourth layers 121b and 124b may include a conductive material such as TiN, WN Ti, or W.

In an implementation, the first and third layers 121a and 124a may include a first conductive material (e.g., TiN or W), and the second and fourth layers 121b and 124b may include a second conductive material (e.g., Ti or W), different from the first conductive material.

In an implementation, each of the first and second gate layers 112g and 124g may be formed of doped polysilicon, a metal-semiconductor compound (e.g., TiSi, TaSi, CoSi, NiSi, or WSi), a metal nitride (e.g., TiN, TaN, or WN) or metals (e.g., Ti or W).

Among the first and second gate layers 112g and 124g, a single or a plurality of lower gate layers 112g_L may include a lower select gate, a single or a plurality of upper gate layers 124g_U may include an upper select gate, and an intermediate gate layers 112g_M and 124g_M may include wordlines. The intermediate gate layers 112g_M and 124g_M, which may be wordlines, may be between the single or plurality of lower gate layers 112g_L and the single or plurality of upper gate layers 124g_U.

Next, various modified example of some components of a semiconductor device according to an example embodiment will be described with reference to FIGS. 4 to 11, respectively. Each of FIGS. 4 to 11 is a partially enlarged view of a modified example of some components of the semiconductor device 1 described with reference to FIGS. 1A to 3, and is a partially enlarged view illustrating a region corresponding to region "A" of FIG. 1A. Hereinafter, various modified examples of the semiconductor device according to an example embodiment described with reference to FIGS. 4 to 11 may be applied to the cross-sectional structures of FIGS. 1A and 1B, even unless otherwise specified.

Figure 4:
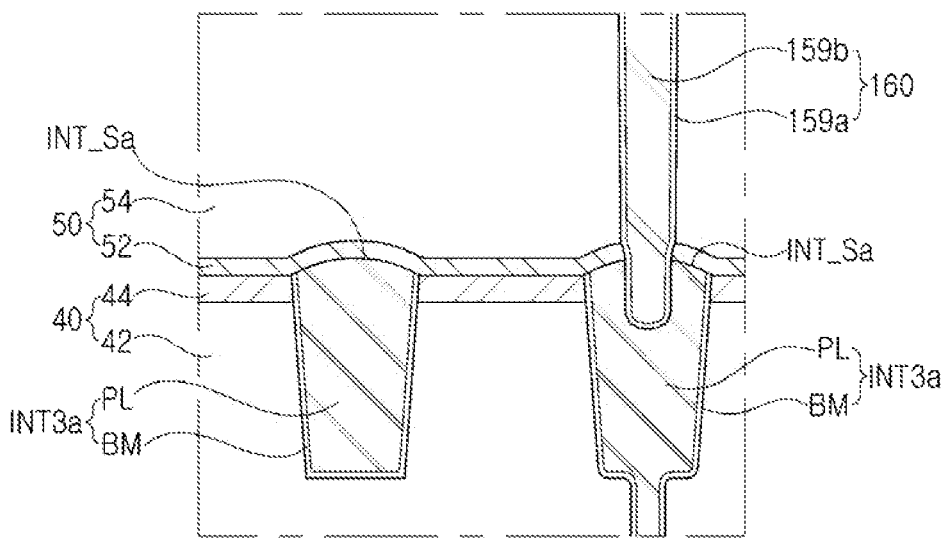
FIG. 4 is a partially enlarged schematic cross-sectional view of a modified example of a semiconductor device according to an example embodiment.

In a modified example, referring to FIG. 4, the above-described upper connection pattern (INT3 of FIG. 2) may be modified into the upper connection pattern INT3a as in FIG. 4. At least a portion of the upper surface INT_Sa of the upper connection pattern INT3a may have a convex shape. In an implementation, the upper connection pattern INT3a may have the upper surface INT_Sa having a convex shape.

By forming the upper surface INT_Sa of the upper connection pattern INT3a to have a convex shape, an overall volume of the upper connection pattern INT3a may be increased and resistance characteristics may be improved.

Figure 5:
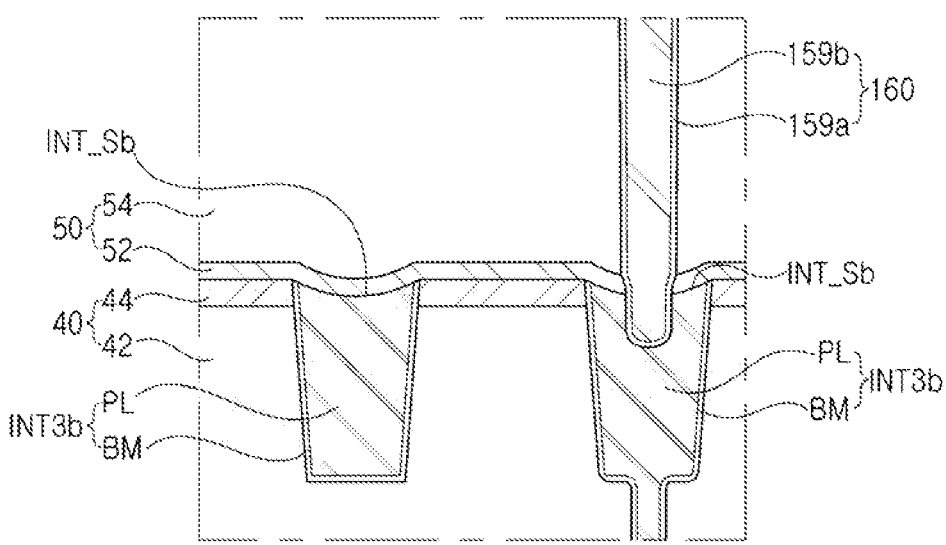
FIG. 5 is a partially enlarged schematic cross-sectional view of a modified example of a semiconductor device according to an example embodiment.

In a modified example, referring to FIG. 5, the above-described upper connection pattern (INT3 of FIG. 2) may be modified into the upper connection pattern INT3b as in FIG. 5. At least a portion of the upper surface INT_Sb of the upper connection pattern INT3b may have a concave shape. In an implementation, the upper connection pattern INT3b may have the upper surface INT_Sa having a concave shape.

By forming the upper surface INT_Sa of the upper connection pattern INT3a to have a concave shape, resistance characteristics may be improved.

Figure 6:
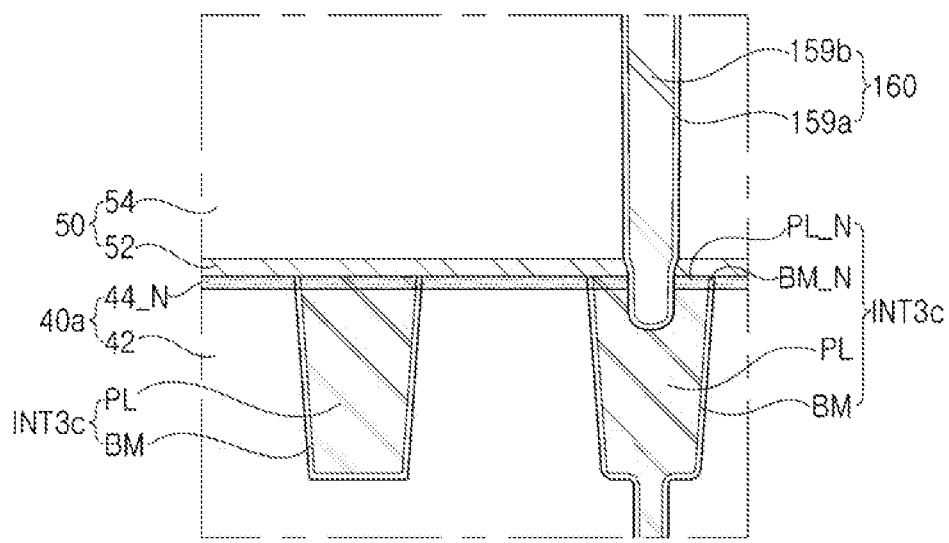
FIG. 6 is a partially enlarged schematic cross-sectional view of a modified example of a semiconductor device according to an example embodiment.

In a modified example, referring to FIG. 6, the above-described first upper insulating portion (40 of FIG. 2) may be modified into a first upper insulating portion 40a including a second lower layer 44_N which may be formed by nitriding the first lower layer (42 of FIG. 2) and an upper region of the first lower layer 42. Accordingly, the first upper insulating portion 40a may include the first lower layer 42 and the second lower layer 44_N on the first lower layer 42. The first lower layer 42 may be formed of a silicon oxide, and the second lower layer 44_N may be formed of a silicon oxynitride (SiON) that may be formed by nitriding a silicon oxide using a plasma nitridation process. The first upper layer 52 may be formed of a silicon nitride by a deposition process.

The second lower layer 44_N may contact the first upper layer 52 of the second upper insulating portion 50, as described above.

The above-described upper connection pattern (INT3 of FIG. 2) may include a metal material pattern PL and a conductive barrier layer BM covering a side surface and a bottom surface of the metal material pattern PL. Such an upper connection pattern (INT3 of FIG. 2) may be modified into an upper connection pattern INT3c further including nitride regions PL_N and BM_N that may be formed by a nitridation process of forming the second lower layer 44_N.

The nitride regions PL_N and BM_N of the upper connection pattern INT3c may include a first nitride region PL_N, in which an upper region of the metal material pattern PL is nitrided, and a first nitride region BM_3 in which an upper region of the conductive barrier layer BM is nitrided. When the metal material pattern PL is formed of tungsten, the first nitride region PL_N may be formed of WN. When the conductive barrier layer BM is formed of TiN, the second nitride region PL_N may be formed of TiN having an increased concentration of nitrogen (N).

The contact plug 160 may penetrate through the nitride regions PL_N and BM_N of the upper connection pattern INT3c, and may contact the metal material pattern PL below the nitride regions PL_N and BM N.

Figure 7:
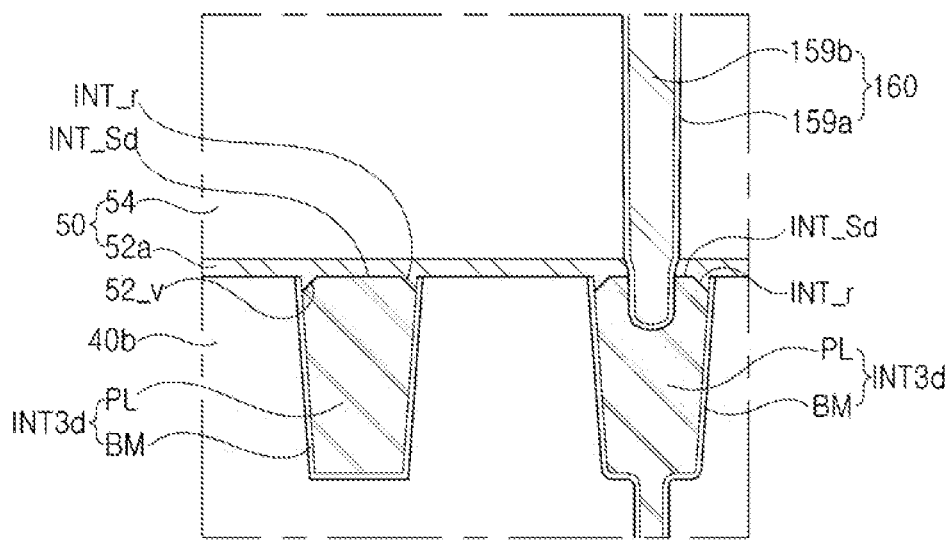
FIG. 7 is a partially enlarged schematic cross-sectional view of a modified example of a semiconductor device according to an example embodiment.

In a modified example, referring to FIG. 7, the above-described upper connection pattern (INT3 of FIG. 2) may be modified into the upper connection pattern INT3d as in FIG. 7. The upper connection pattern INT3d may include a metal material pattern PL and a conductive barrier layer BM covering a side surface and a bottom surface of the metal material pattern PL. Upper surfaces INT_Sd and INT_r of the metal material pattern PL of the upper connection pattern INT3d may include a central portion INT_Sd and an edge portion INT_r recessed as compared with the center portion INT Sd.

The above-described first upper insulating portion (40 of FIG. 2) may be modified into a first upper insulating portion 40b formed of a silicon oxide layer.

In the above-described second upper insulating portion (50 in FIG. 2), the first upper layer (52 in FIG. 2) may be modified into a first upper layer 52a contacting an upper surface of the first upper insulating portion 40b and contacting an upper surface of the upper connection pattern INT3d. The first upper layer 52a may be formed of a silicon nitride.

The first upper layer 52a may contact the central portion INT_Sd and the recessed edge portion INT_r of the upper surfaces INT_Sd and INT_r of the metal material pattern PL, and may contact an upper end of the conductive barrier layer BM.

The first upper layer 52a may include an extension portion 52_v extending between the upper end of the conductive barrier layer BM and the metal material pattern PL.

The recessed edge portion INT_r may be referred to as a groove between the upper end of the conductive barrier layer BM and the metal material pattern PL. Accordingly, the upper end of the conductive barrier layer BM may be spaced apart from the metal material pattern PL by the recessed edge portion, e.g., the groove INT_r.

In a modified example, referring to FIG. 8, the first upper insulating portion 40 may include a first lower layer 42 and a second lower layer 44 on the first lower layer 42, as described with reference to FIG. 2. The above-described upper connection pattern (INT3 of FIG. 2) may be modified into the upper connection pattern INT3d of FIG. 7. The first upper layer (52 of FIG. 2) of the second upper insulating portion (50 of FIG. 2) described above may be modified into the first upper layer 52a as in FIG. 7. Accordingly, the first upper layer 52a may contact the center portion INT_Sd and the recessed edge portion INT_r of the upper surfaces INT_Sd and INT_r of the metal material pattern PL, and may contact the upper end of the conductive barrier layer BM, as described with reference to FIG. 7.

The recessed edge portion INT_r may be referred to as a groove between the upper end of the conductive barrier layer BM and the metal material pattern PL. Accordingly, the upper end of the conductive barrier layer BM may be spaced apart from the metal material pattern PL by the recessed edge portion, e.g., the groove INT_r. A difference in heights between the lower end of the groove INT_r and the upper end of the upper connection pattern INT3d may be smaller than a thickness of the second lower layer 44.

The groove INT_r may be filled with the first upper layer 52a. In the first upper layer 52a, a portion filling the groove INT_r may be referred to as an extension portion 52_v. Accordingly, the extension portion 52_v of the first upper layer 52a may extend between the upper end of the conductive barrier layer BM and the metal material pattern PL to fill the groove INT_r. The first upper layer 52a may contact the second lower layer 44. A thickness of the second lower layer 44 may be greater than a difference in heights between a lowermost end of the extension portion 52_v of the first upper layer 52a and an uppermost end of the upper connection pattern INT3d.

Figure 9:
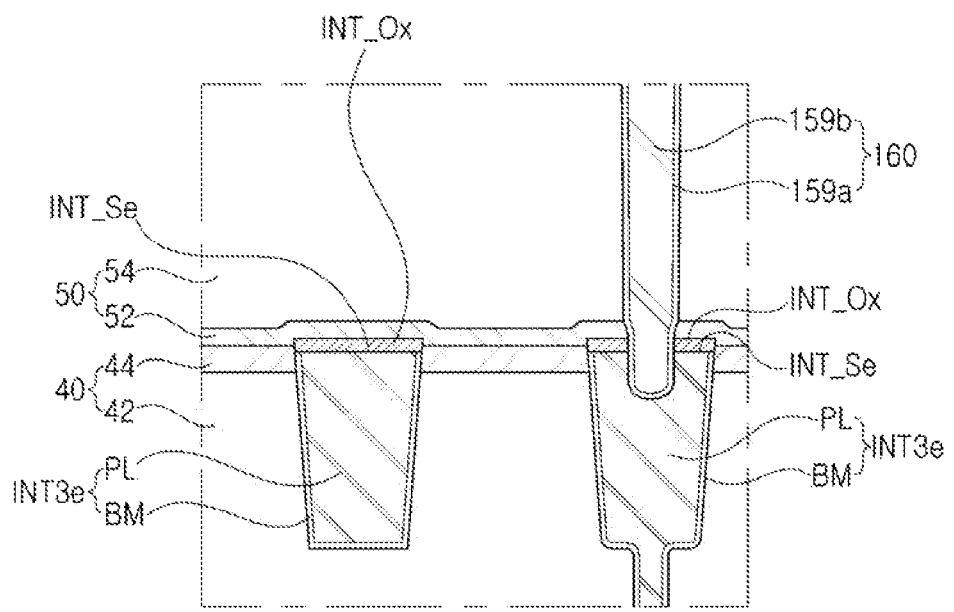
FIG. 9 is a partially enlarged schematic cross-sectional view of a modified example of a semiconductor device according to an example embodiment.

In a modified example, referring to FIG. 9, the above-described upper connection pattern (INT3 of FIG. 2) may be modified into an upper connection pattern INT3e on which a buffer layer INT_Ox is formed as in FIG. 9. The buffer layer INT_Ox may be between the upper connection pattern INT3e and the first upper layer 52. The buffer layer INT_Ox on the upper connection pattern INT3e may include a material formed by oxidizing a material of the upper connection pattern INT3e. In an implementation, the buffer layer INT_Ox may be formed of an oxide (e.g., WO or the like), formed by oxidizing an upper surface of the metal material pattern PL of the upper connection pattern INT3e, and an oxynitride (e.g., TiON) formed by oxidizing an upper surface of the conductive barrier layer BM of the upper connection pattern INT3e.

The buffer layer INT_Ox may have a shape contacting the first upper layer 52 of the second upper insulating portion 50 and the upper connection pattern INT3e between the first upper layer 52 of the second upper insulating portion 50 and the upper connection pattern INT3e.

The upper connection pattern INT3e may have a substantially planar upper surface INT Se.

Figure 10:
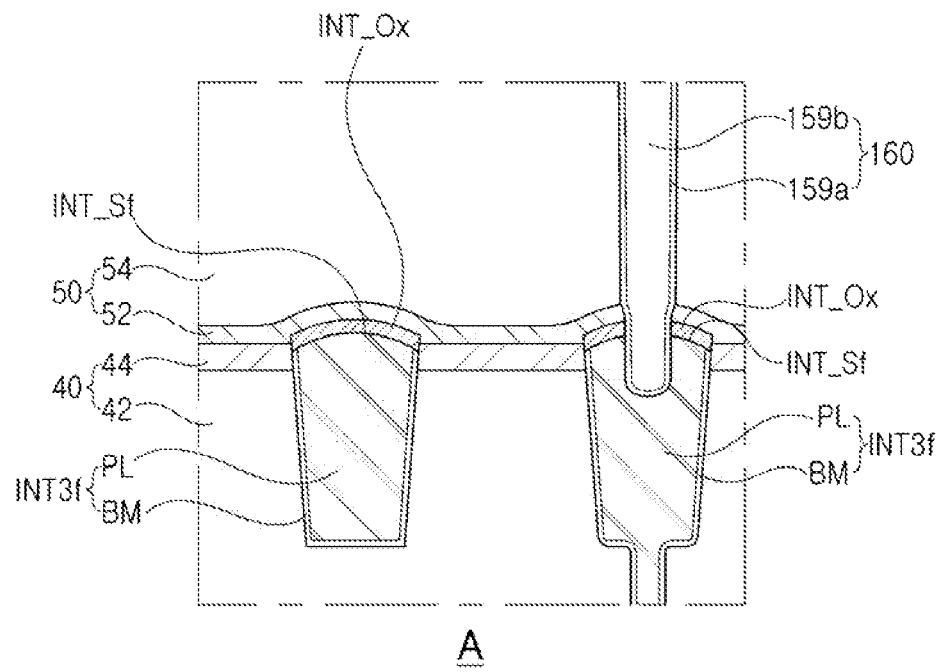
FIG. 10 is a partially enlarged cross-sectional view illustrating a modified example of a semiconductor device according to an example embodiment.

In a modified example, referring to FIG. 10, the upper connection pattern (INT3e of FIG. 9) described in FIG. 9 may be modified into an upper connection pattern INT3f having a convex upper surface INT_Sf. The buffer layer INT_Ox described in FIG. 9 may be modified to be curved upwardly along the convex shape of the upper surface INT_Sf of the upper connection pattern INT3f.

Figure 11:
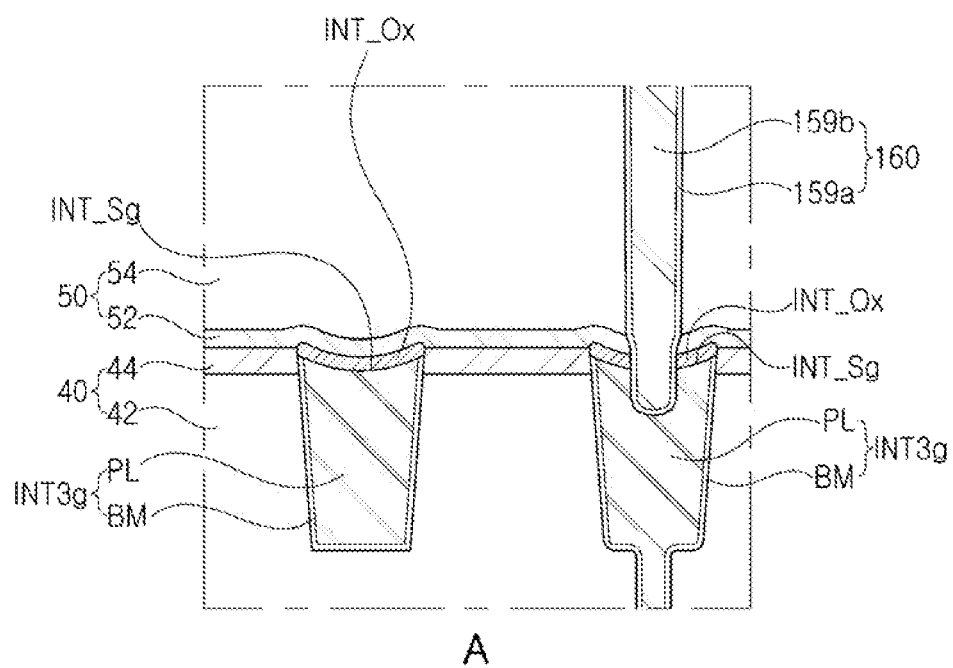
FIG. 11 is a partially enlarged schematic cross-sectional view of a modified example of a semiconductor device according to an example embodiment.

In a modified example, referring to FIG. 11, the upper connection pattern (INT3e of FIG. 9) described in FIG. 9 may be modified into an upper connection pattern INT3g having a concave upper surface INT_Sg. The buffer layer INT_Ox described in FIG. 9 may be modified to be curved downwardly along the concave shape of the upper surface INT_Sf of the upper connection pattern INT3f.

Figure 12A:
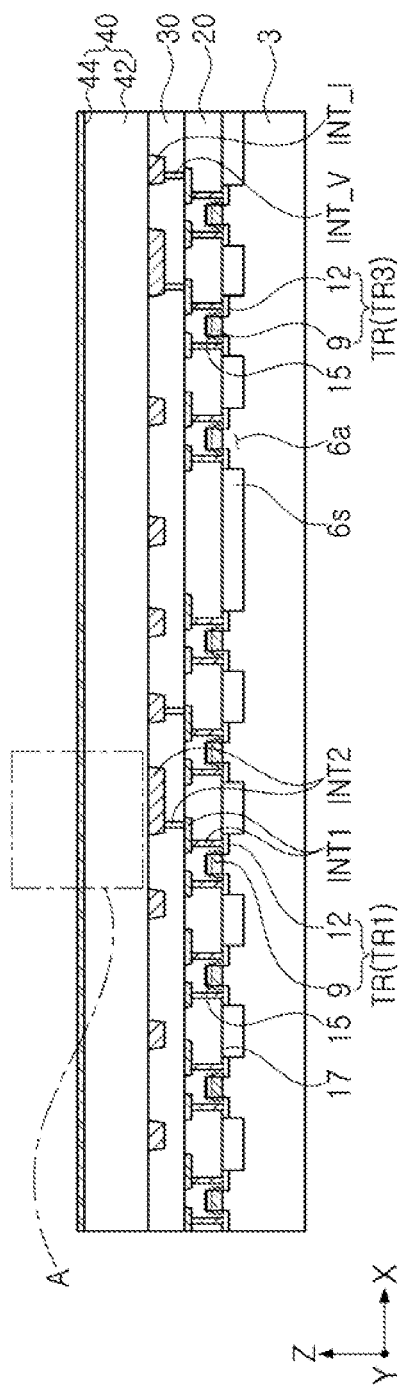
FIGS. 12A to 14B are schematic cross-sectional views of stages in a method of fabricating a semiconductor device according to an example embodiment.
Figure 13A:
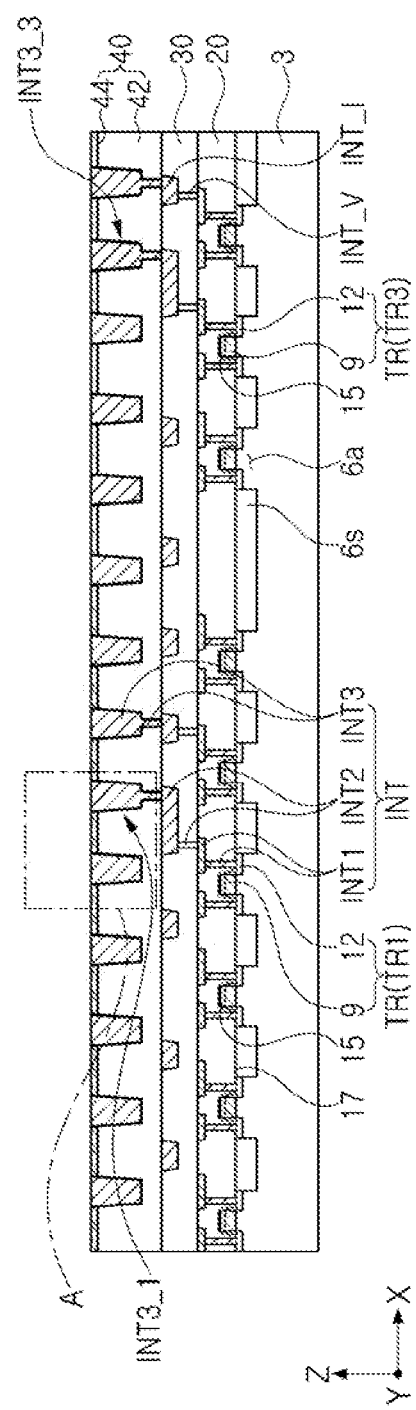
Figure 13B:
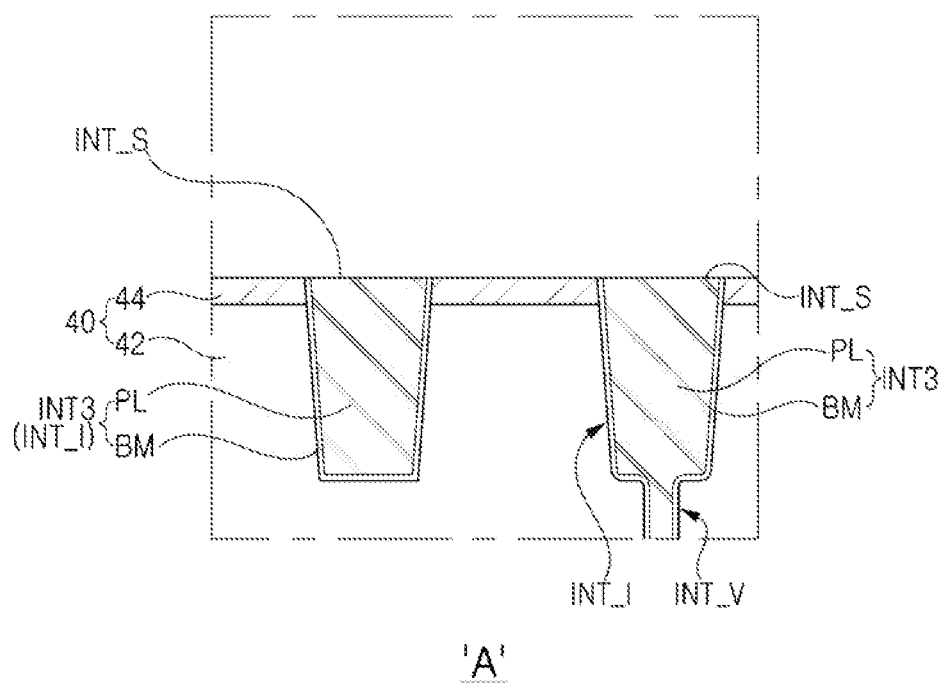
Figure 14A:
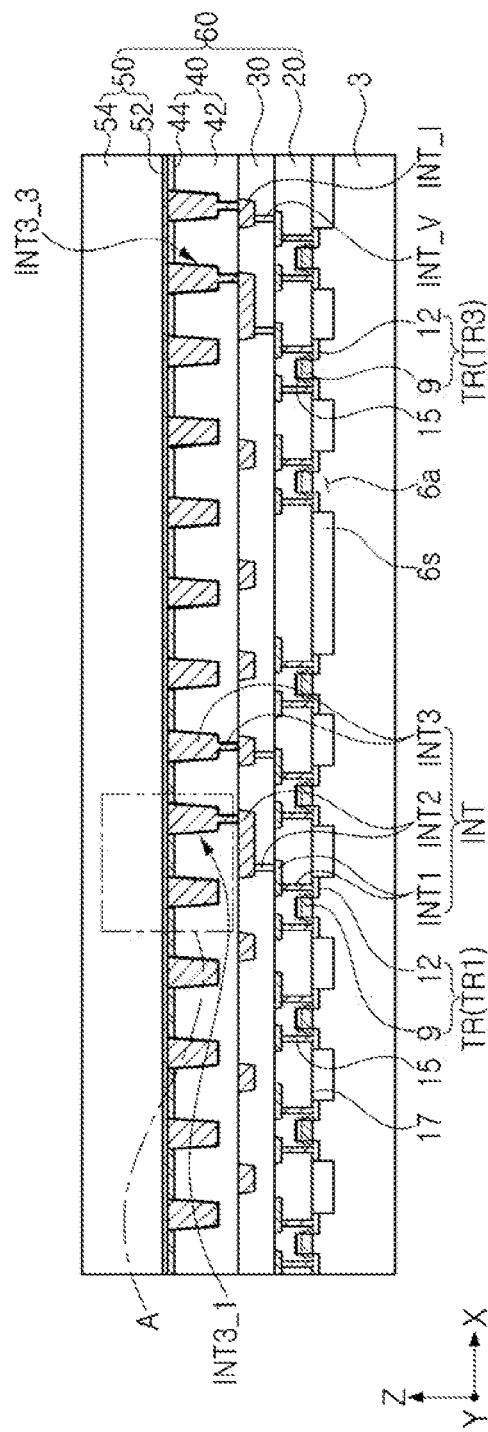
Figure 14B:
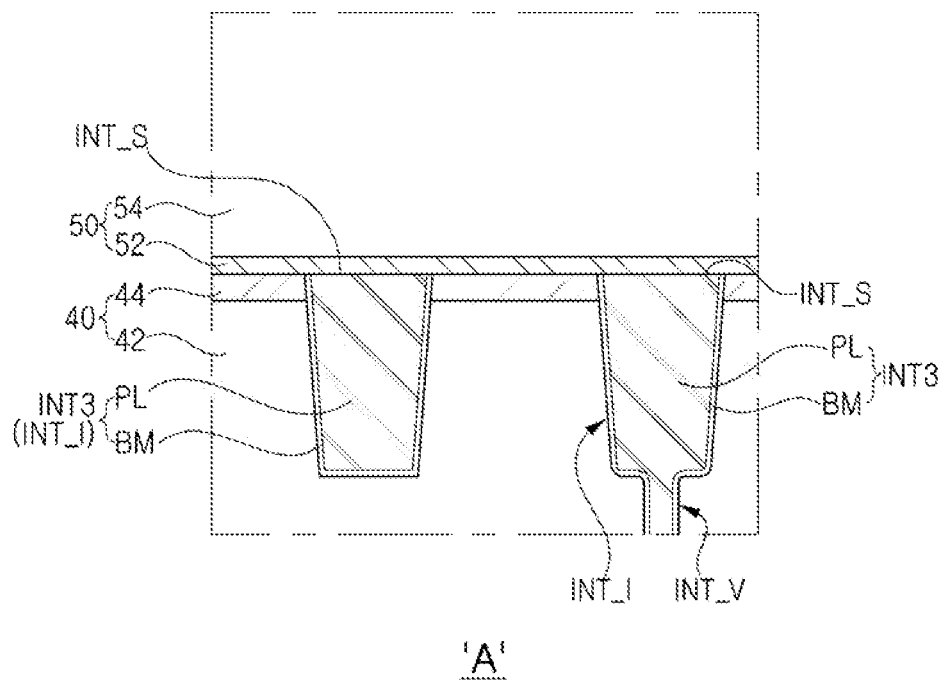

Next, an example of a method of fabricating a semiconductor device according to an example embodiment will be described with reference to FIGS. 12A to 14B. FIGS. 12A to 14B are schematic cross-sectional views of stages in a method of fabricating a semiconductor device according to an example embodiment. FIGS. 12A, 13A, and 14A are longitudinal cross-sectional views of the semiconductor device, taken in an X-direction, FIG. 12b is a partially enlarged view of portion "A" of FIG. 12a, FIG. 13B is a partially enlarged view of portion "A" of FIG. 13A, and FIG. 14B is a partially enlarged view of portion "A" of FIG. 12A.

Figure 12B:
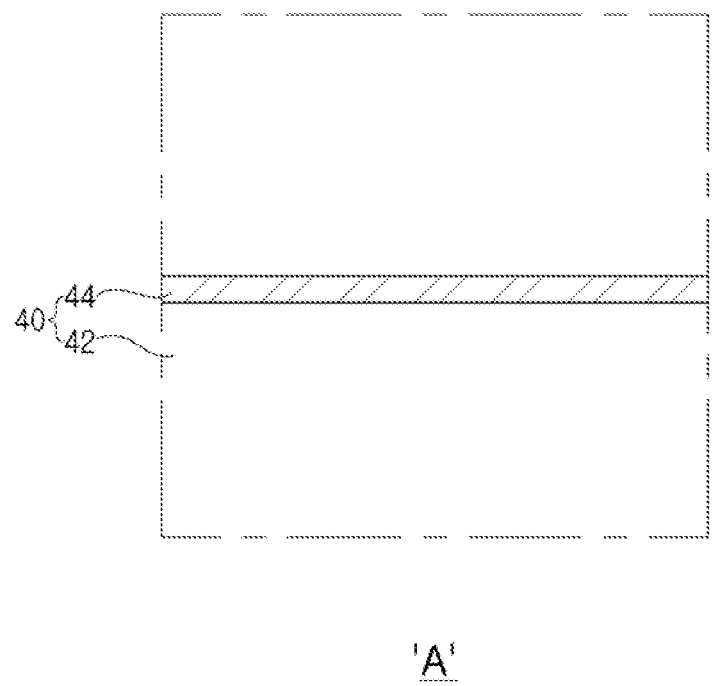

Referring to FIGS. 12A and 12B, a field region 6s may be formed in a semiconductor substrate 3 to define an active region 6a. The field region 6s may be formed as a shallow trench isolation (STI) layer. A circuit device TR may be formed on the semiconductor substrate 3. The circuit device TR may include a plurality of circuit devices TR1, TR2, and TR3. Each of the circuit devices TR1, TR2, and TR3 may include a peripheral gate 9 and peripheral sources/drains 12. A gate capping pattern 15 may be formed on the peripheral gate 9.

An insulating liner 17 may be formed on the semiconductor substrate 3 to cover the circuit device TR and the gate capping pattern 15.

A first lower insulating portion 20 may be formed on the insulating liner 17.

Lower connection patterns INT1 may be formed to be buried in the first lower insulating portion 20. The lower connection patterns INT1 may have upper surfaces, coplanar with an upper surface of the first lower insulating portion 20, and may be electrically connected to the circuit device TR.

A second lower insulating portion 30 may be formed on the first lower insulating portion 20 and the lower connection patterns INT1. An intermediate connection pattern INT2 may be formed to be buried in the second lower insulating portion 30. The intermediate connection pattern INT2 may have an upper surface, coplanar with an upper surface of the second lower insulating portion 30, and may be electrically connected to the lower connection patterns INT1.

A first upper insulating portion 40 may be formed on the second lower insulating portion 30 and the intermediate connection patterns INT2.

The first upper insulating portion 40 may include a first lower layer 42 and a second lower layer 44 having a thickness, smaller than a thickness of the first lower layer 42 on the first lower layer 42. The first lower layer 42 may be formed of a silicon oxide or a low-K dielectric, and the second lower layer 44 may be formed of silicon nitride or a silicon nitride based material.

Referring to FIGS. 13A and 13B, the first upper insulating portion 40 may be patterned to form openings, a conductive material layer may be formed to fill the openings and to cover the first upper insulating portion 40, and the conductive material layer may be planarized until an upper surface of the second lower layer 44 of the first upper insulating portion 40 is exposed, thereby forming upper connection patterns INT3.

Each of the upper connection patterns INT3 may include a metal material pattern PL and a conductive barrier layer BM covering a side surface and a bottom surface of the metal material pattern PL.

Each of the upper connection patterns INT3 may include an interconnection portion INT_I and a via portion INT_V extending downwardly from a portion of the interconnection portion INT_I.

In an implementation, the upper surface INT_S of each of the upper connection patterns INT3 may be planar. In an implementation, each of the upper connection patterns INT3 may include a convex upper surface (INT_Sa of FIG. 4) as illustrated in FIG. 4 and a concave upper surface (INT_Sb of FIG. 5) as illustrated in FIG. 5.

Figure 8:
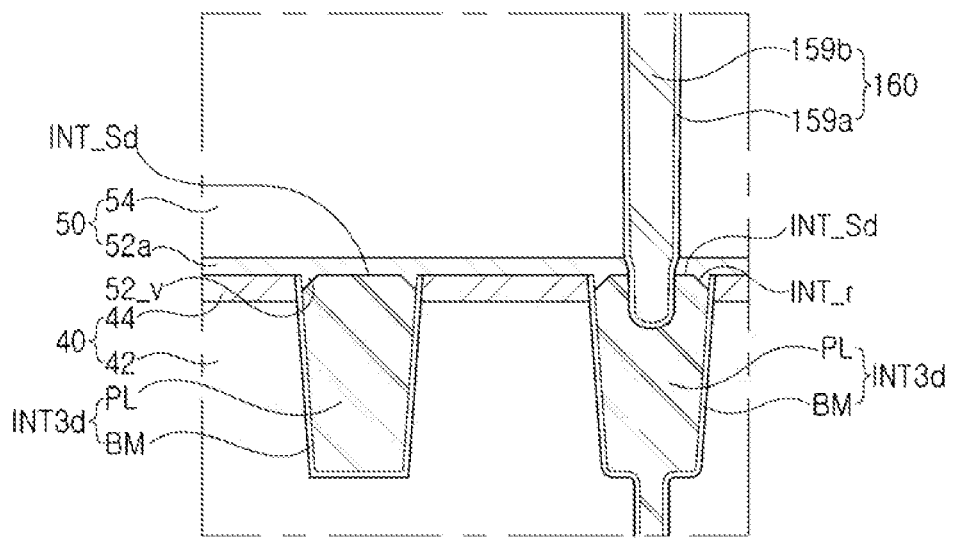
FIG. 8 is a partially enlarged cross-sectional view of a modified example of a semiconductor device according to an example embodiment.

In an implementation, in a planarization process of planarizing the upper connection patterns INT3, an edge of the upper surface of the metal material pattern PL may be eroded in each of the upper connection patterns INT3 to form the upper connection pattern (INT3d of FIGS. 7 and 8) as illustrated in FIGS. 7 and 8.

In an implementation, after a planarization process of planarizing the upper connection patterns INT3, an upper surface of the planarized upper connection pattern may be oxidized to form the buffer layer (INT_Ox of FIGS. 9 to 11) as illustrated in FIGS. 9 to 11.

Referring to FIGS. 14A and 14B, a second upper insulating portion 50 may be formed on the first upper insulating portion 40 and the upper connection patterns INT3. The second upper insulating portion 50 may include a first upper layer 52, contacting the second lower layer 44 and covering the upper connection patterns INT3, and a second upper layer 54 having a thickness, greater than a thickness of the first upper layer 52, on the second upper layer 52. The first upper layer 52 may be formed of silicon nitride or a silicon nitride based material, and the second upper layer 54 may be formed of a silicon oxide or a low-K dielectric.

Accordingly, a lower insulating structure 60 including the first and second lower insulating portions 20 and 30 and the first and second upper insulating portions 40 and 50 may be formed.

Returning to FIGS. 1A and 1B, the upper structure US and the peripheral contact plugs 160 may be formed on the lower insulating structure 60, as described above with reference to FIGS. 1A, 1B, 2, and 3.

Figure 15A:
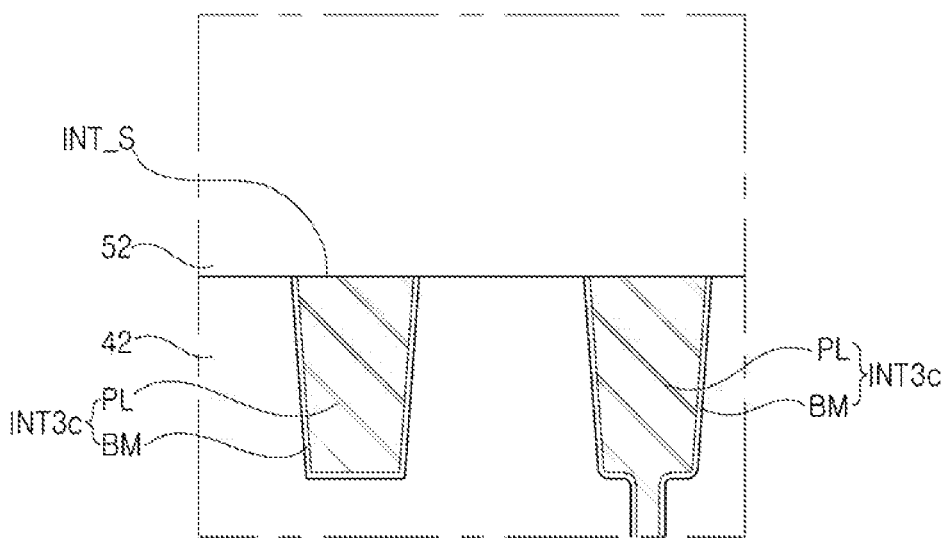
FIGS. 15A to 15C are schematic cross-sectional views of stages in a method of fabricating a semiconductor device according to an example embodiment.
Figure 15B:
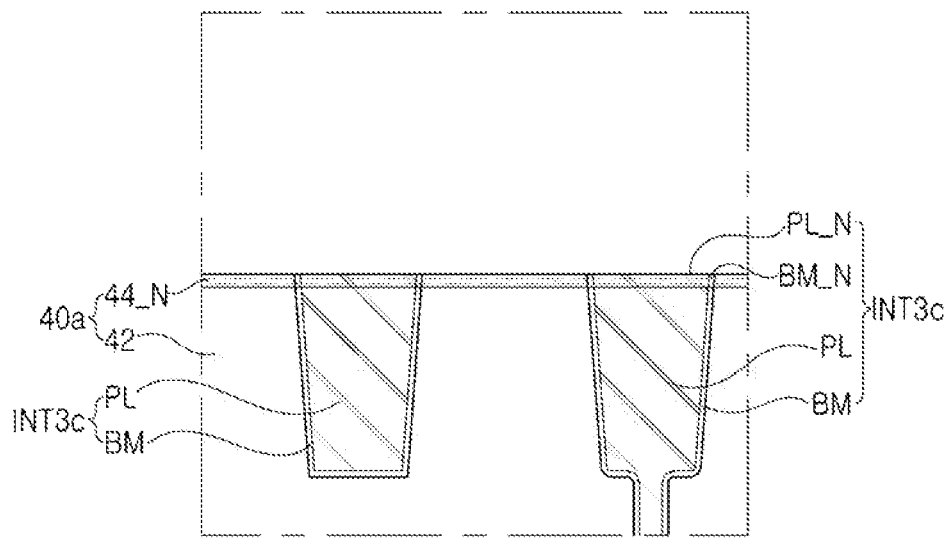
Figure 15C:
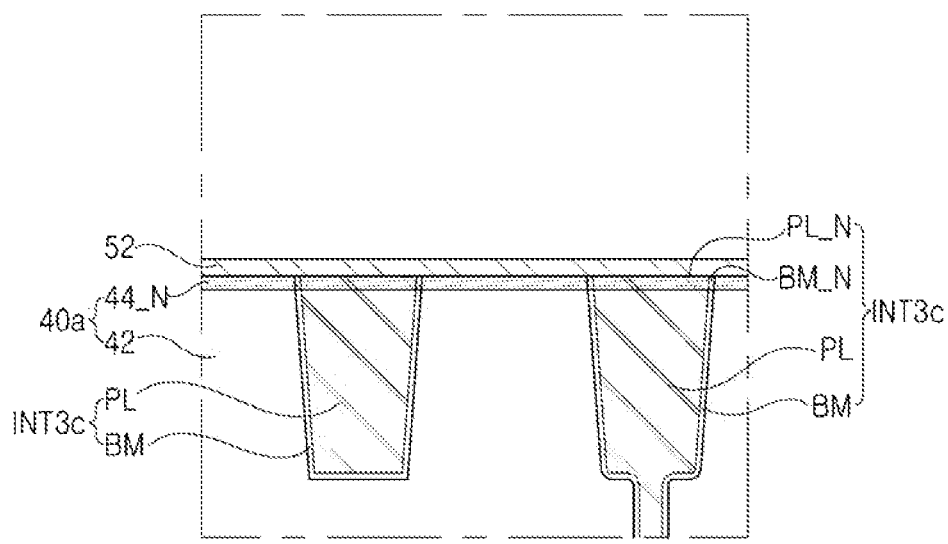

Next, an example of a method of fabricating a semiconductor device according to an example embodiment will be described with reference to FIGS. 15A to 15C. FIGS. 15A to 15C are partially enlarged views of stages in a method of fabricating a semiconductor device according to an example embodiment.

Referring to FIG. 15A, a first lower layer 42 may be formed. The first lower layer 42 may be formed of silicon oxide. An upper connection pattern INT3c may be formed in the first lower layer 42. The upper connection pattern INT3c may have an upper surface INT_S, coplanar with an upper surface of the first lower layer 42. A side surface of the upper connection pattern INT3c may contact the first lower layer 42. The upper connection pattern INT3c may include a metal material pattern PL and a conductive barrier layer BM covering a side surface and a bottom surface of the metal material pattern PL.

Referring to FIG. 15B, a second lower layer 44_N and a nitride region PL_N and BM_N may be formed simultaneously. The second layer layer 44_N may be formed by nitriding an upper region of the first lower layer 42. The second lower layer 44_N may be formed of a silicon oxynitride (SiON) that may be formed by nitriding a silicon oxide using a plasma nitridation process. The nitride region PL_N and BM_N may include a first nitride region PL_N and a second nitride region BM_N. The first nitride region PL_N may be formed by nitriding an upper region of the metal material pattern PL using the plasma nitridation process, and the second nitride region BM_N may be formed by nitriding an upper region of the conductive barrier layer BM using the plasma nitridation process. A first upper insulating portion 40a may include the first lower layer 42 and the second lower layer 44_N, and the upper connection pattern INT3c may include the metal material pattern PL, the conductive barrier layer BM, and the nitride region PL_N and BM_N. Accordingly, the first upper insulating portion 40a and the upper connection pattern INT3c as illustrated in FIG. 6 may be formed.

Referring to FIG. 15C, a first upper layer 52 as illustrated in FIG. 6 may be formed on the first upper insulating portion 40a and the upper connection patterns INT3c. The first upper layer 52 may be formed of silicon nitride by a deposition process.

Next, data storage systems including a semiconductor device according to an example embodiment will be described with reference to FIGS. 16, 17 and 18.

Figure 16:
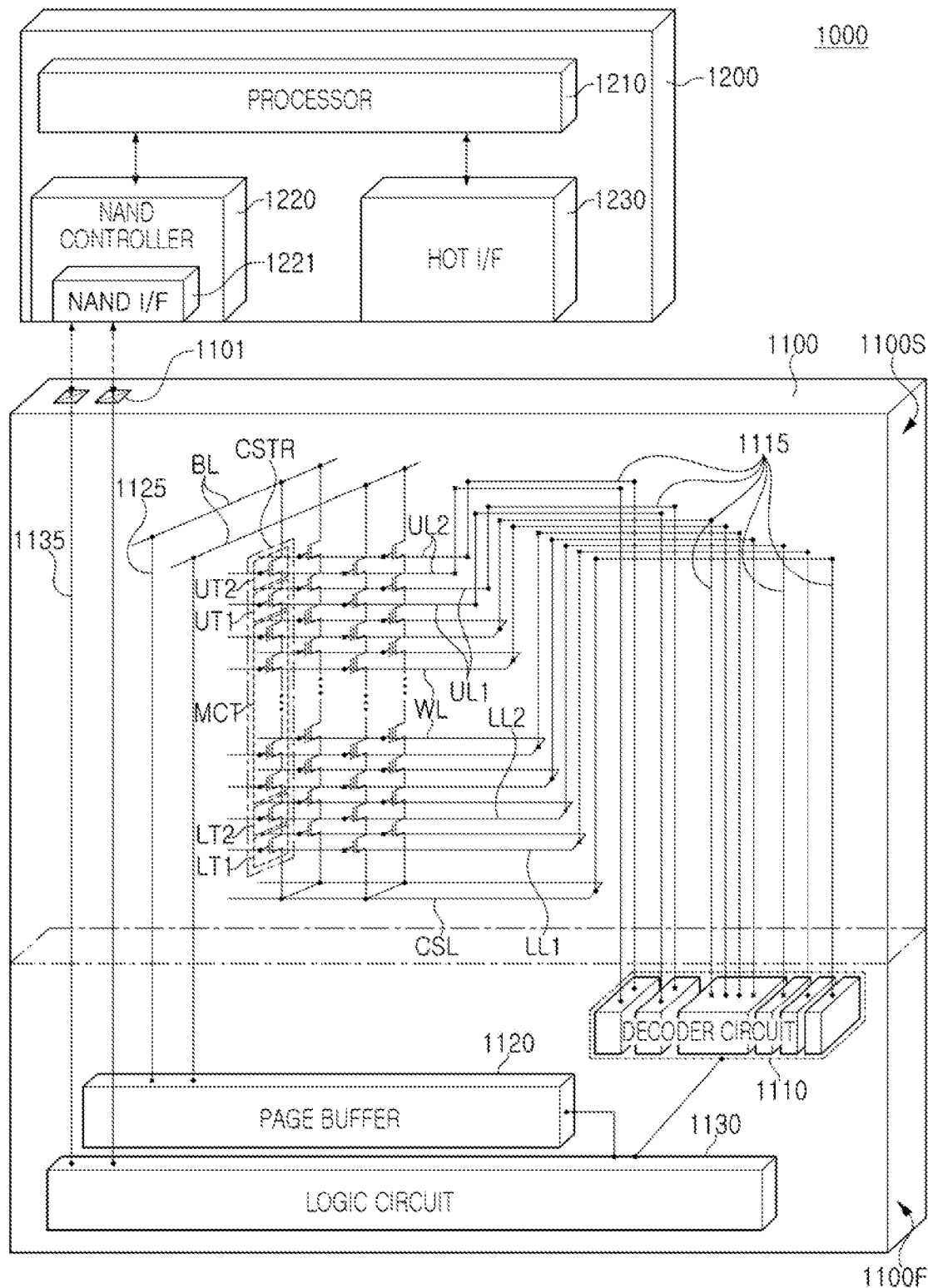
FIG. 16 is a schematic view of a data storage system including a semiconductor device according to an example embodiment.

FIG. 16 is a schematic view of a data storage system including a semiconductor device according to an example embodiment.

Referring to FIG. 16, a data storage system 1000 according to an example embodiment may include a semiconductor device 1100 and a controller 1200 electrically connected to the semiconductor device 1100. The data storage system 1000 may be a storage device including the semiconductor device 1100 or an electronic device including the storage device. In an implementation, the data storage system 1000 may be a solid state drive (SSD) device, a universal serial bus (USB), a computing system, a medical device, or a communication device including the semiconductor device 1100.

In an implementation, the data storage system 1000 may be an electronic system for storing data.

The semiconductor device 1100 may be the semiconductor device according to one of the example embodiments described with reference to FIGS. 1 to 11. The semiconductor device 1100 may include a first structure 1100F and a second structure 1100S on the first structure 1100F.

The first structure 1100F may be the lower structure LS described in FIGS. 1A and 1B, and the second structure 1100S may be the upper structure US described in FIGS. 1A and 1B.

The first structure 1100F may be a peripheral circuit structure including a decoder circuit 1110, a page buffer 1120, and a logic circuit 1130. In an implementation, the first structure 1100F may include the above-described circuit device (TR of FIGS. 1A and 1B). The circuit device (TR of FIGS. 1A and 1B) may be a transistor constituting a peripheral circuit structure including a decoder circuit 1110, a page buffer 1120, and a logic circuit 1130.

Among the plurality of transistors TR of the circuit device TR described in FIGS. 1A and 1B, the first circuit device (TR1 of FIG. 1A) may be a transistor which may constitute the decoder circuit 1110, the second circuit device (TR2 of FIG. 1B) may be a transistor which may constitute the page buffer 1120, and the third circuit device TR3 may be transistor which may constitute the logic circuit 1130.

The second structure 1100S may be a memory structure including a bitline BL, a common source line CSL, wordlines WL, first and second gate upper lines UL1 and UL2, first and second gate lower lines LL1 and LL2, and memory cell strings CSTR between the bitline BL and the common source line CSL.

The above-described pattern structure 103 may include a silicon layer having N-type conductivity. As described above, the silicon layer having the N-type conductivity may be the common source line CSL. In an implementation, in the pattern structure 103, the first intermediate pattern layer (103b1 of FIG. 3) contacting the channel layer (139 in FIG. 3) and the lower pattern layer (103a of FIG. 3) contacting the first intermediate pattern layer 103b1 may be formed of a silicon layer having N-type conductivity and may be a common source line.

In the second structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT between the lower transistors LT1 and LT2 and the upper transistors UT1 and UT2. The number of the lower transistors LT1 and LT2 and the number of the upper transistors UT1 and UT2 may vary according to example embodiments.

In an implementation, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The wordlines WL may be gate electrodes of the memory cell transistors MCT, and the gate upper lines UL1 and UL2 may be gate electrodes of the upper transistors UT1 and UT2, respectively.

The above-described first and second gate layers (112g and 124g of FIGS. 1A, 1B, and 3) may constitute the gate lower lines LL1 and LL2, the wordlines WL, and the gate upper lines UL1, UL2. In an implementation, among the first and second gate layers (112g and 124g of FIGS. 1A, 1B and 3), the single or the plurality of lower gate layers (112g_L of FIG. 3) may constitute the gate lower lines LL1 and LL2, the intermediate gate layers (112g_M and 124g_M in FIG. 3) may constitute the wordlines WL, and the single or the plurality of upper gate layers 124g_U may constitute the gate upper lines UL1 and UL2.

In an implementation, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a gate induce drain leakage (GIDL) phenomenon.

The common source line CSL, the first and second gate lower lines LL1 and LL2, the wordlines WL, and the first and second gate upper lines UL1 and UL2 may be electrically connected to the decoder circuit 1110 via first interconnection lines 1115 extending from the first structure 1100F to the second structure 1100S.

The bitlines BL may be electrically connected to the page buffer 1120 via second interconnection lines 1125 extending from the first structure 1100F to the second structure 1100S. The bitline BL may be the above-described bitlines (178a of FIGS. 1A and 1B).

In the first structure 1100F, the decoder circuit 1110, and the page buffer 1120 may perform a control operation on at least one selected memory cell transistor, among the plurality of memory cell transistors MCT. The decoder circuit 1110 and the page buffer 1120 may be controlled by a logic circuit 1130.

The semiconductor device 1100 may further include an input/output pad 1101. The semiconductor device 1100 may communicate with the controller 1200 via the input/output pad 1101 electrically connected to the logic circuit 1130. The input/output pad 1101 may be electrically connected to the logic circuit 1130 via an input/output connection wiring 1135 extending from the first structure 1100F to the second structure 1100S. Accordingly, the controller 1200 may be electrically connected to the semiconductor device 1100 via the input/output pad 1101, and may control the semiconductor device 1100.

The controller 1200 may include a processor 1210, a NAND controller 1220, and a host interface 1230. In an implementation, the data storage system 1000 may include a plurality of semiconductor devices 1100. In this case, the controller 1200 may control the plurality of semiconductor devices 1100.

The processor 1210 may control overall operations of the data storage system 1000 including the controller 1200. The processor 1210 may operate according to a predetermined firmware, and may access the semiconductor device 1100 by controlling the NAND controller 1220. The NAND controller 1220 may include a NAND interface 1221 processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command is received from an external host through the host interface 1230, the processor 1210 may control the semiconductor device 1100 in response to the control command.

Figure 17:
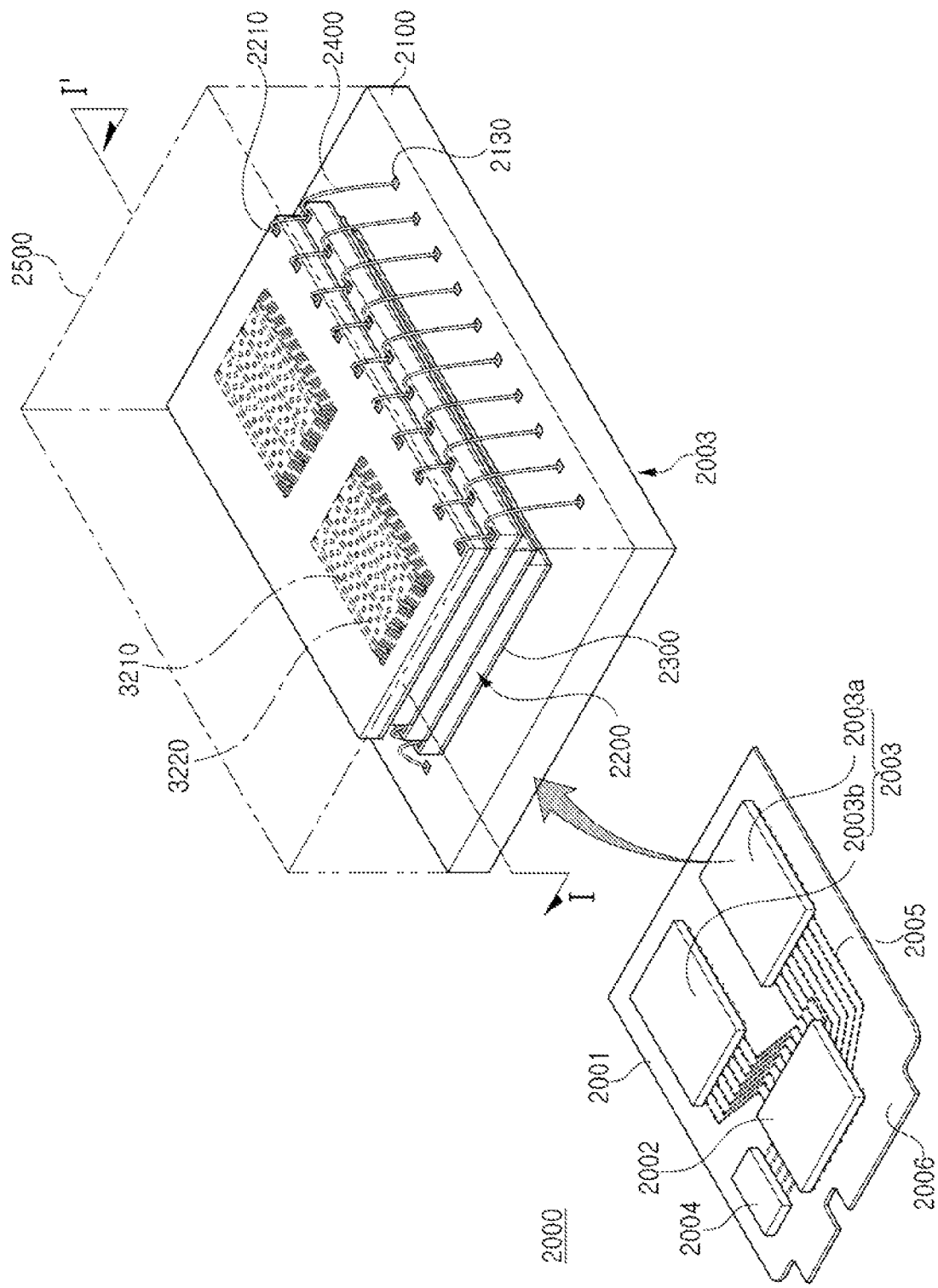
FIG. 17 is a schematic perspective view of a data storage system including a semiconductor device according to an example embodiment.

FIG. 17 is a schematic perspective view of a data storage system including a semiconductor device according to an example embodiment.

Referring to FIG. 17, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number of the plurality of pins and arrangement of the plurality of pins in the connector 2006 may vary according to a communication interface between the data storage system 2000 and the external host. In an implementation, the data storage system 2000 may communicate with an external host according to one of interfaces such as an M-PHY for universal serial bus (USB), peripheral component interconnect express (PCI-Express), serial advanced technology attachment (SATA), and universal flash storage (UFS). In an implementation, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be a buffer memory for mitigating a difference in speeds between the semiconductor package 2003, which is a data storage space, and an external host. The DRAM 2004 included in the data storage system 2000 may also operate as a type of cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the semiconductor chips 2200 may include the semiconductor device described in one of the example embodiments described with reference to FIGS. 1 to 11.

Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210.

In an implementation, the connection structure 2400 may be a bonding wire electrically connecting the input/output pad 2210 to the package upper pads 2130. Accordingly, in each of the first and second semiconductor packages 2003a and 2003b, the semiconductor chips 2200 may be electrically connected to each other by a wire bonding method, and may be electrically connected to the package upper pads 2130 of the package substrate. In an implementation, in each of the first and second semiconductor packages 2003a and 2003b, the semiconductor chips 2200 may be electrically connected to each other by a connection structure including a through-silicon via (TSV), rather than the connection structure 2400 of a wire bonding method.

In an implementation, the controller 2002 and the semiconductor chips 2200 may be included in a single package. In an implementation, the controller 2002 and the semiconductor chips 2200 may be mounted on an interposer substrate different from the main substrate 2001, and the controller 2002 and the semiconductor chips 2200 may be connected to each other by an interconnection formed on the interposer substrate.

Figure 18:
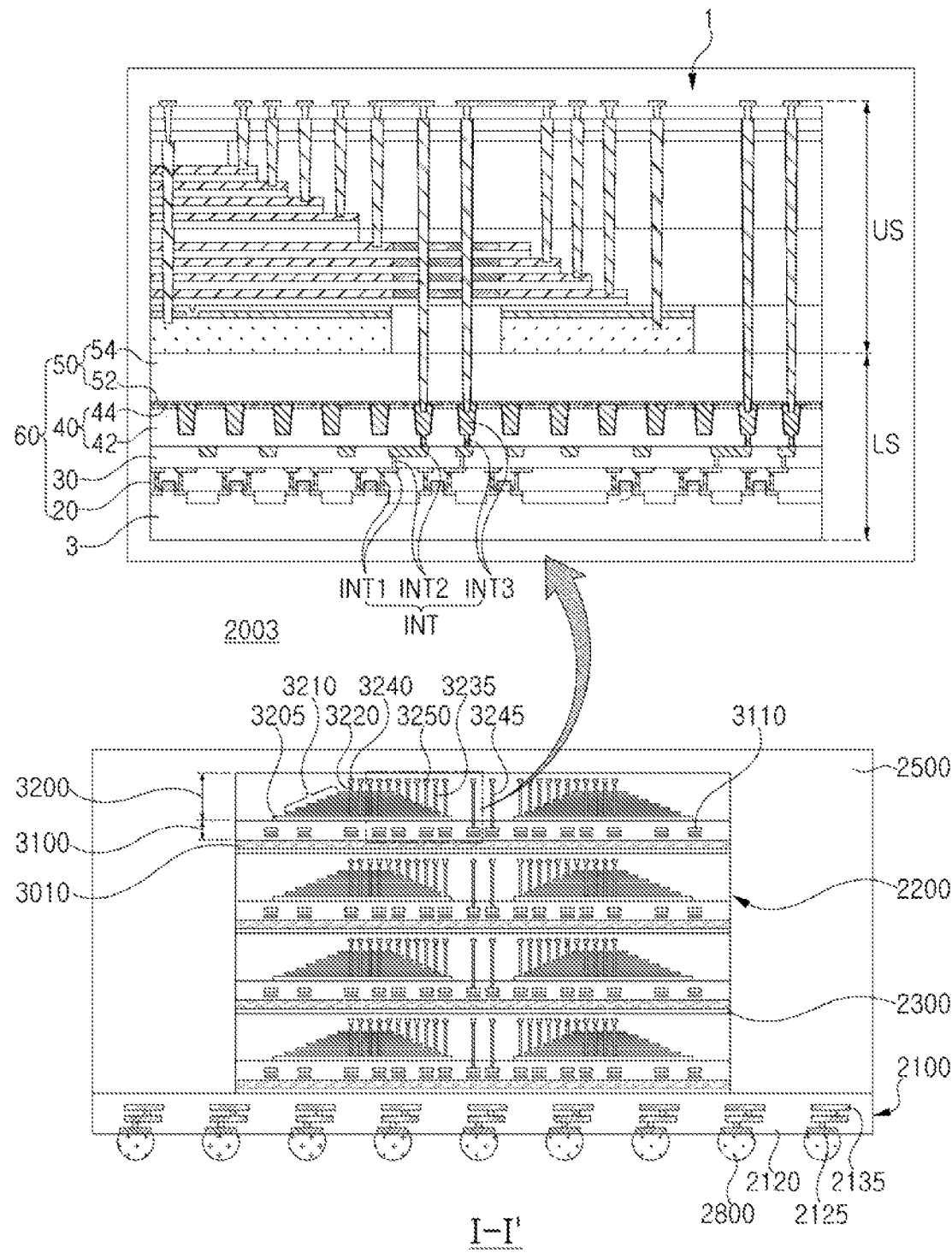
FIG. 18 is a schematic cross-sectional view of a data storage system including a semiconductor device according to an example embodiment.

FIG. 18 is a schematic cross-sectional view of a semiconductor package according to an example embodiment. FIG. 18 illustrates an example embodiment of the semiconductor package 2003 of FIG. 17, and conceptually illustrates the semiconductor package 2003 taken along line I-I' of FIG. 17.

Referring to FIGS. 17 and 18, in the semiconductor package 2003, the package substrate 2100 may be a printed circuit board. The package substrate 2100 may include a package substrate body 2120, package upper pads 2130 on the upper surface of the package substrate body 2120, lower pads 2125 on the lower surface of the package substrate body 2120 and exposed through the lower surface, and internal interconnections 2135 electrically connecting the package upper pads 2130 to the lower pads 2125 in the package substrate body 2120. The package upper pads 2130 may be electrically connected to the connection structures 2400. The lower pads 2125 may be connected to the interconnection patterns 2005 of the main substrate 2010 of the data storage system 2000 through conductive connectors 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral interconnections 3110. The second structure 3200 may include a common source line 3205, memory channel structures 3220 and the separation structures 3230 penetrating through the gate stack structure 3210, bitlines 3240 electrically connected to the memory channel structures 3220, and gate contact plugs (106 of FIG. 2A) electrically connected to the wordlines WL of the gate stack structure 3210. The first structure 3100 may include the first structure 1100F of FIG. 16, and the second structure 3200 may include the second structure of FIG. 16.

Each of the semiconductor chips 2200 may include a through-interconnection 3245 electrically connected to the peripheral interconnections 3110 of the first structure 3100 and extending inwardly of the second structure 3200. The through-interconnection 3245 may penetrate through the gate stack structure 3210, and may be further outside the gate stack structure 3210.

Each of the semiconductor chips 2200 may further include an input/output connection interconnection 3265, electrically connected to the peripheral interconnections 3110 of the first structure 3100 and extending inwardly of the second structure 3200, and an input/output pad 2210 electrically connected to the input/output connection interconnection 3265.

In FIG. 18, a partially enlarged portion of the semiconductor device 1 denoted by reference numeral 1 is provided to illustrate that the semiconductor chips 2200 of FIG. 18 may be modified to have the cross-sectional structure as in FIG. 1A. Therefore, each of the semiconductor chips 2200 may include the semiconductor device 1 according to one of the example embodiments described with reference to FIGS. 1A to 11.

As described above, according to example embodiments, a semiconductor device including connection patterns at different levels on a semiconductor substrate, a lower insulating structure covering the connection patterns, memory cells arranged three-dimensionally on the lower insulating structure, and contact plugs contacting upper connection patterns, among the connection patterns, may be provided. The lower insulating structure may include a first insulating portion on side surfaces of the upper connection patterns, and a second insulating portion on the first insulating portion and the upper connection patterns. The first insulating portion may include a first lower layer and a second lower layer, having a thickness smaller than a thickness of the first lower layer, on the first lower layer. The second insulating portion may include a first upper layer, contacting the second lower layer and covering at least a portion of an upper surface of the upper connection pattern, and a second upper layer having a thickness, greater than a thickness of the first upper layer, on the first upper layer. A material of the second lower layer and the first upper layer may be different from a material of the first lower layer and the second upper layer.

In an example embodiment, the second lower layer and the first upper layer contacting each other may prevent a bridge defect between the upper connection patterns adjacent to each other. Accordingly, leakage current may be prevented from being generated between the adjacent upper connection patterns adjacent to each other.

In an example embodiment, each of the upper connection patterns may include a plug portion and a conductive barrier layer covering a side surface and a bottom surface of the plug portion, and a groove may be formed between the plug portion and an upper end of the conductive barrier layer. The groove formed between the plug portion and the upper end of the conductive barrier layer may prevent leakage current from being generated between the upper connection patterns adjacent to each other.

According to embodiments, a bridge defect and leakage current between the adjacent upper connection patterns may be prevented, and the degree of integration of the upper connection patterns may be improved. As a result, the degree of integration of the semiconductor device may be improved.

One or more embodiments may provide a semiconductor device, capable of improving the degree of integration thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a lower structure including a semiconductor substrate, a circuit device on the semiconductor substrate, a circuit interconnection structure including connection patterns electrically connected to the circuit device and at different height levels, and a lower insulating structure covering the circuit device and the circuit interconnection structure on the semiconductor substrate;
an upper structure on the lower structure and including wordlines stacked and spaced apart from each other in a vertical direction, a vertical memory structure penetrating through the wordlines, and a bitline electrically connected to the vertical memory structure on the vertical memory structure; and
a contact plug forming at least a portion of a signal path electrically connecting at least one of the bitline and the wordlines and at least one of the connection patterns to each other, wherein:
the connection patterns include an upper connection pattern contacting the contact plug;
the lower insulating structure includes a first insulating portion on a side surface of the upper connection pattern and a second insulating portion on the first insulating portion and on the upper connection pattern;
the contact plug penetrates through the second insulating portion and contacts the upper connection pattern;
the first insulating portion includes a first lower layer and a second lower layer on the first lower layer, the second lower layer having a thickness smaller than a thickness of the first lower layer;
the second insulating portion includes:
a first upper layer contacting the second lower layer and covering at least a portion of an upper surface of the upper connection pattern, and
a second upper layer on the first upper layer, the second upper layer having a thickness greater than a thickness of the first upper layer; and
a material of the second lower layer and the first upper layer is different from a material of the first lower layer and the second upper layer.

2. The semiconductor device as claimed in claim 1, wherein the thickness of the first upper layer is different from the thickness of the second lower layer.

3. The semiconductor device as claimed in claim 1, wherein the thickness of the first upper layer is smaller than the thickness of the second lower layer.

4. The semiconductor device as claimed in claim 1, wherein:
the thickness of the second lower layer is in a range of about 400 angstroms to about 600 angstroms; and
the thickness of the first upper layer is in a range of about 285 angstroms to about 315 angstroms.

5. The semiconductor device as claimed in claim 1, wherein:
the material of the first lower layer and the second upper layer is a silicon oxide; and
the material of the second lower layer and the first upper layer is a silicon nitride.

6. The semiconductor device as claimed in claim 1, wherein the first upper layer contacts at least the portion of the upper surface of the upper connection pattern.

7. The semiconductor device as claimed in claim 1, further comprising:
a buffer layer between the first upper layer and the upper connection pattern,
wherein the buffer layer contacts the first upper layer and the upper connection pattern.

8. The semiconductor device as claimed in claim 7, wherein the buffer layer includes an oxide of a material of the upper connection pattern.

9. The semiconductor device as claimed in claim 1, wherein:
the first lower layer includes a silicon oxide;
the second lower layer includes a silicon oxynitride formed by nitriding a silicon oxide using a plasma nitridation process; and
the first upper layer includes a silicon nitride formed by a deposition process.

10. The semiconductor device as claimed in claim 9, wherein:
an upper region of the upper connection pattern includes a region nitrided by the plasma nitridation process; and
the contact plug penetrates through the nitrided region of the upper connection pattern and contacts the upper connection pattern.

11. The semiconductor device as claimed in claim 1, wherein the upper connection pattern has a convex upper surface.

12. The semiconductor device as claimed in claim 1, wherein the upper connection pattern has a concave upper surface.

13. The semiconductor device as claimed in claim 1, wherein:
the contact plug includes:
a first portion penetrating through the second upper layer;
a second portion penetrating through the first upper layer; and
a third portion extending inwardly in the upper connection pattern and contacting the upper connection pattern; and
a minimum width of the second portion is smaller than a maximum width of the first portion.

14. The semiconductor device as claimed in claim 1, wherein:
the upper structure further includes a pattern structure including a silicon layer;
the vertical memory structure includes an insulating core region, a channel layer covering at least a side surface of the insulating core region, and a data storage structure covering at least an external side surface of the channel layer;
the data storage structure includes a first dielectric layer, a second dielectric layer, and a data storage layer between the first and second dielectric layers; and
the channel layer contacts the silicon layer.

15. The semiconductor device as claimed in claim 14, wherein:
the upper structure further includes insulating layers stacked and spaced apart from each other in the vertical direction;

at least some of the insulating layers are at a same height level as the wordlines; and the contact plug penetrates through the insulating layers and extends downwardly to contact the upper connection pattern.

16. A semiconductor device, comprising:

a lower structure including a semiconductor substrate, a circuit device on the semiconductor substrate, a circuit interconnection structure including connection patterns electrically connected to the circuit device and at different height levels, and a lower insulating structure covering the circuit device and the circuit interconnection structure on the semiconductor substrate;

an upper structure on the lower structure and including wordlines stacked and spaced apart from each other in a vertical direction, a vertical memory structure penetrating through the wordlines, and a bitline electrically connected to the vertical memory structure on the vertical memory structure; and a contact plug forming at least a portion of a signal path electrically connecting at least one of the bitline and the wordlines and at least one of the connection patterns to each other, wherein:

the connection patterns include an upper connection pattern contacting the contact plug;

the lower insulating structure includes a first insulating portion on a side surface of the upper connection pattern and a second insulating portion on the first insulating portion and on the upper connection pattern;

the contact plug penetrates through the second insulating portion and contacts the upper connection pattern;

the upper connection pattern includes a plug portion and a barrier layer covering a side surface and a bottom surface of the plug portion;

the upper connection pattern includes a groove between an upper end of the barrier layer and the plug portion, in an upper region of the upper connection pattern;

the second insulating portion includes:

a first upper layer contacting the first insulating portion and covering at least a portion of an upper surface of the upper connection pattern, and a second upper layer on the first upper layer, the second upper layer having a thickness greater than a thickness of the first upper layer;

the upper end of the barrier layer is spaced apart from the plug portion by the groove; and a material of the first upper layer is different from a material of the second upper layer.

17. The semiconductor device as claimed in claim 16, wherein:

the first insulating portion includes a first lower layer and a second lower layer on the first lower layer, the second lower layer having a thickness smaller than a thickness of the first lower layer, and a material of the second lower layer and the material of the first upper layer are different from a material of the first lower layer and the material of the second upper layer.

18. The semiconductor device as claimed in claim 17, wherein:

the groove is filled with the first upper layer; and a difference in height levels between a lower end of the groove and an upper end of the upper connection pattern is smaller than the thickness of the second lower layer.

19. A data storage system, comprising:

a semiconductor device including an input/output pad; and a controller electrically connected to the semiconductor device through the input/output pad and configured to control the semiconductor device, wherein:

the semiconductor device includes:

a lower structure including a semiconductor substrate, a circuit device on the semiconductor substrate, a circuit interconnection structure including connection patterns electrically connected to the circuit device and at different height levels, and a lower insulating structure covering the circuit device and the circuit interconnection structure on the semiconductor substrate;

an upper structure on the lower structure and including wordlines stacked and spaced apart from each other in a vertical direction, a vertical memory structure penetrating through the wordlines, and a bitline electrically connected to the vertical memory structure on the vertical memory structure; and a contact plug forming at least a portion of a signal path electrically connecting at least one of the bitline and the wordlines and at least one of the connection patterns to each other, the connection patterns include an upper connection pattern contacting the contact plug;

the lower insulating structure includes a first insulating portion on a side surface of the upper connection pattern and a second insulating portion on the first insulating portion and the upper connection pattern;

the contact plug penetrates through the second insulating portion and contacts the upper connection pattern;

the first insulating portion includes a first lower layer and a second lower layer on the first lower layer, the second lower layer having a thickness smaller than a thickness of the first lower layer;

the second insulating portion includes:

a first upper layer contacting the second lower layer and covering at least a portion of an upper surface of the upper connection pattern, and a second upper layer on the first upper layer, the second upper layer having a thickness greater than a thickness of the first upper layer; and a material of the second lower layer and the first upper layer is different from a material of the first lower layer and the second upper layer.

20. The data storage system as claimed in claim 19, wherein:

the upper connection pattern includes a plug portion and a barrier layer covering a side surface and a bottom surface of the plug portion;

the upper connection pattern has a groove between an upper end of the barrier layer and the plug portion, in an upper region of the upper connection pattern; and the upper end of the barrier layer is spaced apart from the plug portion by the groove.

* * * * *